United States Patent
Haushalter et al.

(10) Patent No.: US 7,229,500 B2
(45) Date of Patent: Jun. 12, 2007

(54) METHODS AND DEVICES FOR HIGH THROUGHPUT CRYSTALLIZATION

(75) Inventors: Robert C. Haushalter, Los Gatos, CA (US); Xiao-Dong Sun, Fremont, CA (US)

(73) Assignee: Parallel Synthesis Technologies, Inc., Santa Clara, CA (US)

(*) Notice: Subject to any disclaimer, the term of this patent is extended or adjusted under 35 U.S.C. 154(b) by 493 days.

(21) Appl. No.: 10/432,079

(22) PCT Filed: Nov. 20, 2001

(86) PCT No.: PCT/US01/42968

§ 371 (c)(1),
(2), (4) Date: Oct. 24, 2003

(87) PCT Pub. No.: WO02/42731

PCT Pub. Date: May 30, 2002

(65) Prior Publication Data

US 2004/0062691 A1    Apr. 1, 2004

Related U.S. Application Data

(60) Provisional application No. 60/252,259, filed on Nov. 20, 2000.

(51) Int. Cl.
*C30B 25/12*    (2006.01)

(52) U.S. Cl. ............................. 117/95; 117/89; 117/92

(58) Field of Classification Search ................. 117/86, 117/89, 92
See application file for complete search history.

(56) References Cited

U.S. PATENT DOCUMENTS 5,869,604 A    2/1999    Rousseau et al. ........... 530/344

(Continued)

FOREIGN PATENT DOCUMENTS

WO    WO 00/60345    10/2000

OTHER PUBLICATIONS

"The Role of Protein Crystals in Biotechnology and Industry", Alexander McPherson, Frontiers in Bioprocessing II, 1992 American Chemical Society, pp. 10-15.

(Continued)

*Primary Examiner*—Felisa Hiteshew
(74) *Attorney, Agent, or Firm*—Duane Morris LLP

(57) ABSTRACT

Crystallization Photoresist (PR) apparatus and methods which allow for fast screening and determination of protein crystallization conditions with small protein quantities and rapid crystallization. The apparatus comprise a first region comprising a first nucleation catalyst material and a second region comprising a second nucleation catalyst material, with the first and second regions positioned adjacent to each other and configured to support at least one crystal, and with the first region having a variation in a nucleation property of the first nucleation catalyst material in the first region. The crystal may be supported at an interface of the adjacent regions. The methods comprise providing a first region of a first nucleation catalyst material and a second region of a second nucleation catalyst material adjacent said first region, with the first region having a variation in a nucleation property of the first nucleation catalyst material, exposing the first and second regions to a solution of a selected molecule, and growing at least one crystal of the molecule in association with the first and second regions.

64 Claims, 23 Drawing Sheets

U.S. PATENT DOCUMENTS 6,110,273 A     8/2000   Sanjoh .......................... 117/68
6,258,331 B1    7/2001   Sanjoh ..................... 422/245.1
6,420,178 B1 *   7/2002   LaGraff et al. ............. 422/102
6,605,258 B2 *   8/2003   LaGraff et al. ............. 422/102

OTHER PUBLICATIONS

"Chemical and Structural Approaches to Rational Drug Design", Alexander McPherson, CRC Press Inc., 1995, pp. 161-179.
"Macromolecular Crystals", Alexander McPherson, Scientific American, Mar. 1989, pp. 62-70.
"Heterogeneous and Epitaxial Nucleation of Protein Crystals on Mineral Surfaces", Alexander McPherson et al., American Association for the Advancement of Science, 1988, vol. 239, pp. 385-387.
"Facilitation of the Growth of Protein Crystals by Heterogeneous/Epitaxial Nucleation", Alexander McPherson et al.,Journal of Crystal Growth, 1987, pp. 206-214.
Pubilcation: Journal of Crystal Growth, vol. 174 Date: (1997) Title: Application of Exhaustive Lattice Match Searches to the Selection of Epitaxial Susbtrates for Protein Crystal Growth Author: Paul J. Shlichts pp. 480-486.

* cited by examiner

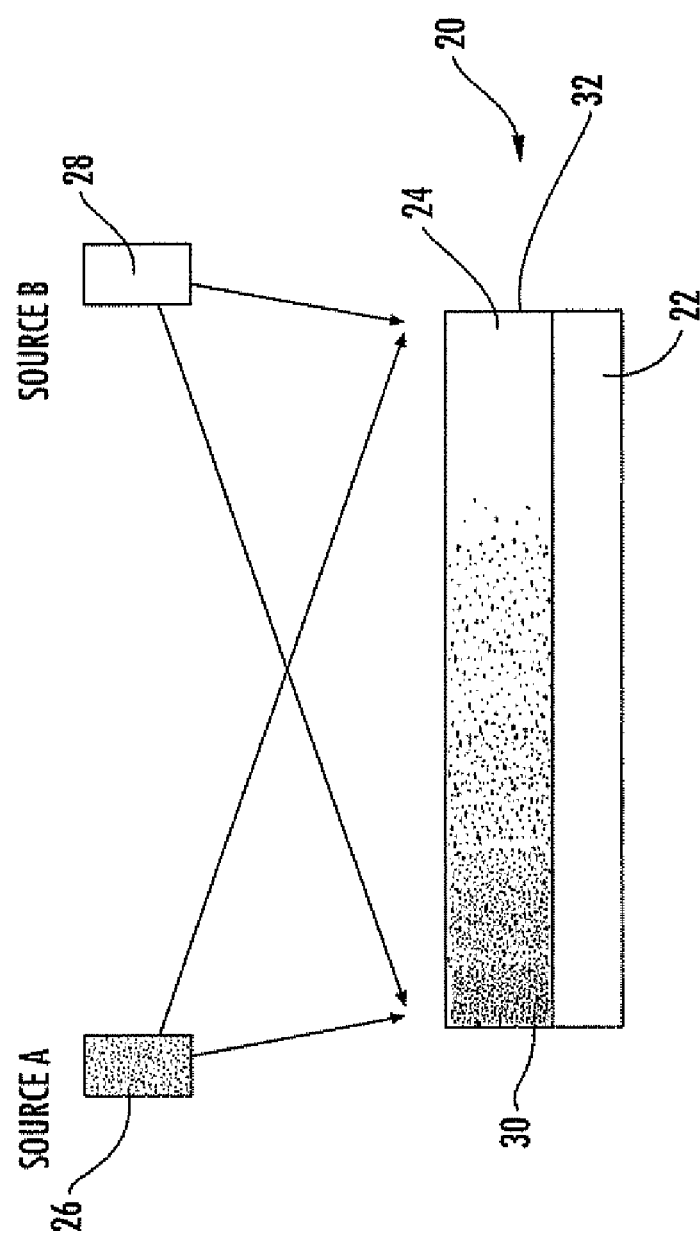

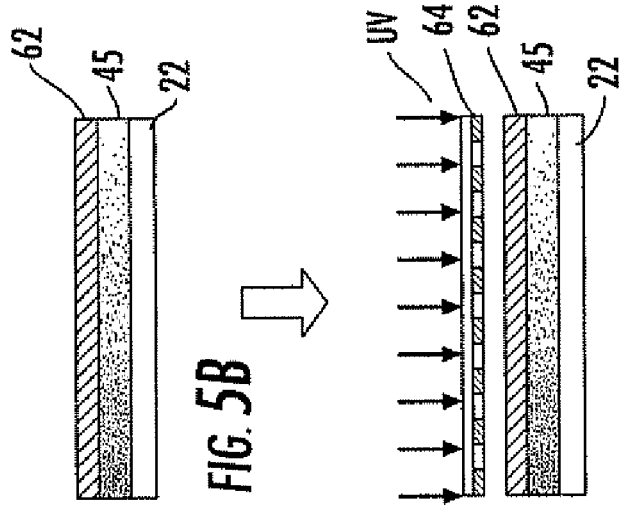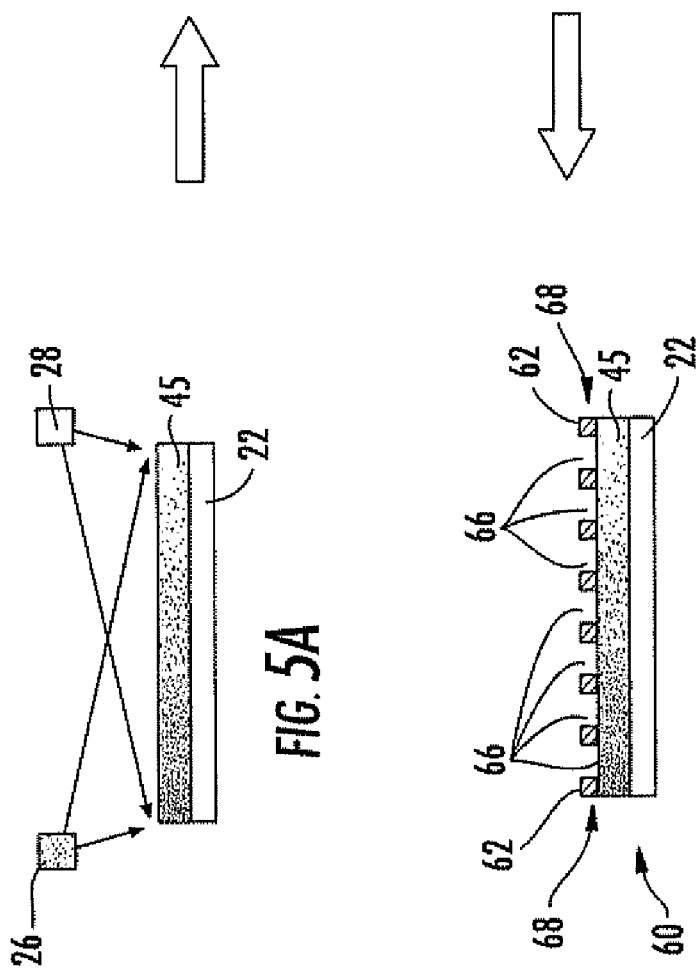

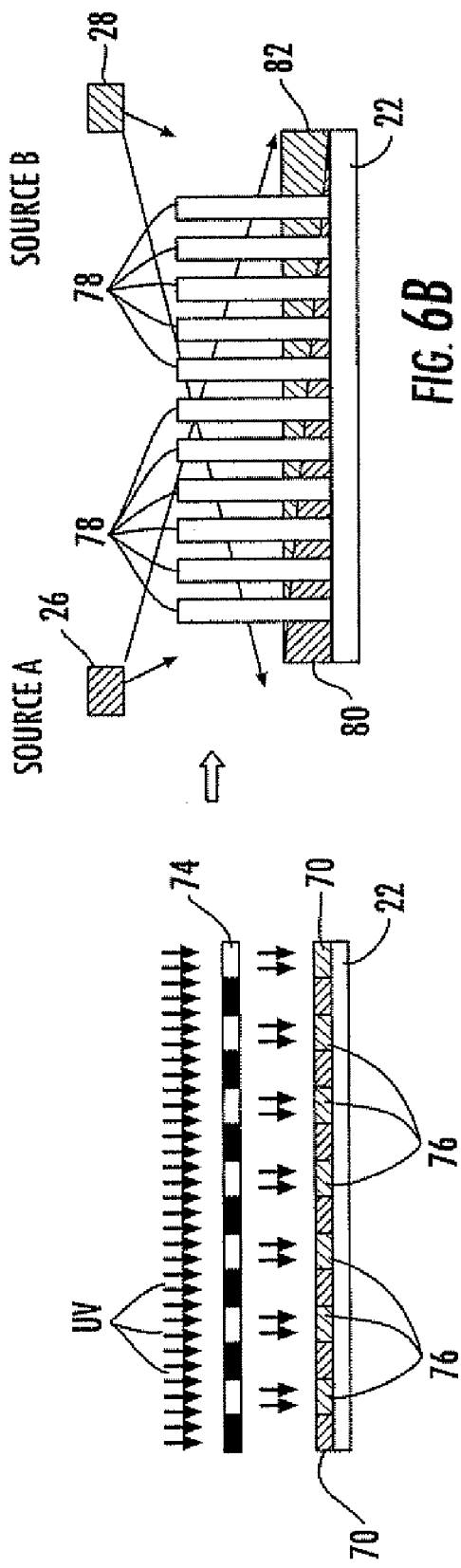
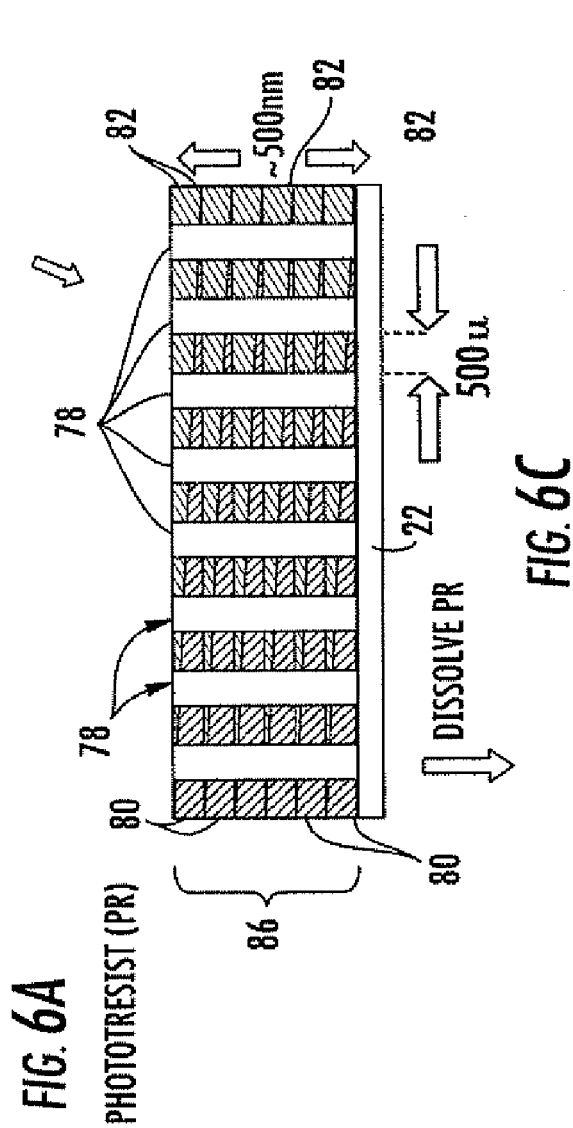

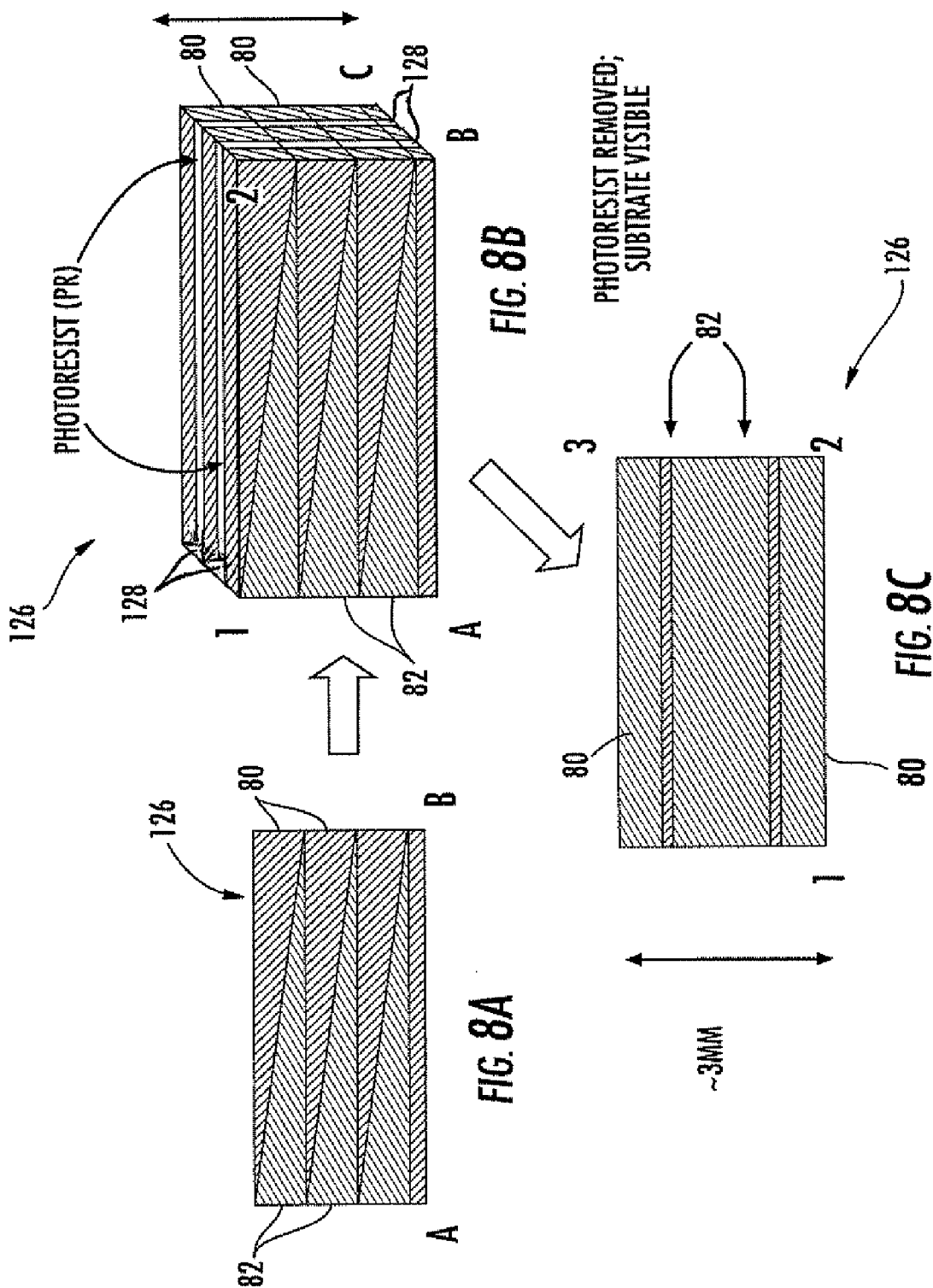

METHODS AND DEVICES FOR HIGH THROUGHPUT CRYSTALLIZATION

CROSS-REFERENCE

This application is a National Stage of International Application No. PCT/US01/42968, filed on Nov. 20, 2001, published in English, and incorporated herein by reference, which claimed priority benefit of U.S. Provisional Application No. 60/252,259 filed Nov. 20, 2000.

GOVERNMENT RIGHTS

The United States Government may have certain rights in this application pursuant to NIH Grant No. 0214949.

FIELD OF THE INVENTION

Crystallization apparatus and methods for the nucleation and crystal growth of molecules and in particular, proteins.

BACKGROUND OF THE INVENTION

The recent progress in molecular biology and its application to medicine, agriculture, and industrial processes has been crucially dependent on structure determinations at the atomic level of macromolecules such as nucleic acids, viruses, large macromolecular complexes and in particular proteins. Redundancies of structural elements now emerging from recently determined protein structures suggests that the number of structural motifs and substructures (domains) naturally occurring in many proteins may be finite, and that these molecular motifs may be classified and catalogued according to specific polypeptide folds. With the majority of protein motifs being determined, structural and functional predictions based primarily on the amino acid sequence may be possible for unknown proteins. With the influx of genomic information presently available, there is more interest being placed in determining the three dimensional structure of proteins encoded by newly identified gene sequences.

The three dimensional structures of proteins has had a dramatic impact on biotechnology and in particular the therapeutic treatment of certain diseases. Determining the three dimensional structure of proteins provides the essential information necessary for identifying and developing new drugs and pharmaceutical products which interact with these proteins (McPherson, Proceedings of Frontiers in Bioprocessing II, (American Chemical Society Boulder, Colo., 1992, pp. 10–15; McPherson, Rational Drug Design, CRC Press, 1994, Chptr. 6, p 170). The three dimensional structure of proteins and other macromolecules is the basis for identifying lead compounds to treat a host of human ailments, veterinary problems, crop diseases in agriculture, and other uses. For example, if the three dimensional structure of the active site of a salient enzyme in a metabolic or regulatory pathway is known, then chemical compounds, such as regulatory drugs, can be rationally designed to inhibit or otherwise affect the behavior of that enzyme.

Another area of biotechnology that also requires knowledge of three-dimensional macromolecular structure is the area of protein genetic engineering. Although recombinant DNA techniques provide the essential synthetic role that permits modification of proteins, protein structure determination provides the analytical function. A three-dimensional protein structure serves as a structural guide or template for intelligent and purposeful protein modifications rather than random and chance amino acid substitutions. Obtaining a three-dimensional structure of the genetically engineered protein is also useful in determining what future chemical and physical enhancement would be profitable endeavors.

Presently, and in the foreseeable future, the only technique that can yield atomic level structural images of biological macromolecules is X-ray diffraction analysis as applied to single crystals. While other methods may produce important structural and dynamic data, for the purposes described above, only X-ray crystallography is adequate. X-ray crystallography is absolutely dependent on crystals of the macromolecule of interest, and not simply crystals, but crystals of sufficient size and quality to permit accurate data collection. The quality of the final structural image is directly determined by the perfection, size and physical properties of the crystalline specimen, hence the crystal becomes the keystone element of the entire process, and the ultimate determinant of its success (McPherson et al., Scientific American, 260 (3) 62–69 (1989).

A considerable degree of success has been achieved recently in the area of macromolecular crystallization. Many new protein structures are rapidly being completed. Unfortunately, some major problems still remain, and in particular, the crystallization of a protein is still the primary obstacle in structure determination. This is particularly true of some major classes of proteins, such as the immunoglobulins, highly dynamic and mobile multidomain molecules, lipophilic molecules, membrane proteins, multimeric protein complexes as well as many small proteins and polypeptides, including hormones.

In the crystal growth of small, non-polymeric molecules, the problem of nucleation is frequently obviated by using seed crystals of the material under study, and in those cases the problems of crystallization arise principally arise from control of growth mechanisms and kinetics. Unfortunately, with macromolecules and proteins whose structures remain undetermined, simple seeding is not possible due to the lack of the availability of preexisting crystals. When a protein is being crystallized for the first time, nucleation is of particular significance.

One aspect of crystal growth, which has been useful in the nucleation of macromolecules, is the recognition that surfaces that contact the solution (mother liquor) from which crystals are formed, are of substantial importance in accelerating the nucleation process. Molecules, and especially macromolecules having extensive surfaces with diverse charge distributions, adsorb to, and are concentrated at surfaces in contact with their solutions. In addition, many surfaces, because of their own charge properties and microstructure, help to organize the macromolecules into more ordered assemblies and unit structures. Such surfaces thus serve to promote the formation of critical nuclei. Thes surfaces tend to act as catalysts to lower the activation energy for macromolecular nucleation and increase the probability that nuclei will form to initiate the crystallization process.

One method of crystal growth has been developed where the electrical state of the nucleant has been shown to encourage macromolecular nucleation (see, e.g., U.S. Pat. No. 6,110,273 and U.S. Pat. No. 6,258,331). In this method, a substrate with a layer of n-type silicon on p-type silicon provides adjacent layers of contrasting electrical properties. The substrate is patterned lithographically using a photoresist to define grooves or channels of varying depths and with different cross-sectional shapes or patterns. Valence electrons are controlled in the substrate such that the concentration of holes or electrons in the substrate surface can be controlled in response to the environment of the solution (containing the macromolecule) that is exposed to the substrate. The valence electron control facilitates crystallization of the macromolecule inside, rather than outside, of the grooves in the substrate.

There has also been an effort to develop a crystal growth apparatus that facilitates the crystallization of biological macromolecules. One such apparatus involves a liquid reservoir for crystal growth, with passages for transferring the liquid from the first reservoir to a second liquid reservoir. The first reservoir holding the liquid for growing crystals is made of general-purpose material such as glass while the second liquid reservoir is formed on a doped silicon substrate. The material of the second reservoir has valence electrons that are controllable so that the concentration of holes or electrons can be controlled in response to the environment of the solution containing the macromolecule. This allows for the crystals to be grown on a silicon substrate that has been placed in a predetermined electric state.

One of the most serious problems in protein crystallization is the high supersaturation concentrations of the protein which are required for spontaneous nucleation. These high supersaturations are often above the solution stability of the protein, resulting in the formation of numerous small, disordered, unusable crystals instead of a few large, well diffracting, x-ray quality crystals. One crystallization technique that avoids the need for high supersaturation concentrations involves the use of heterogeneous nucleants for protein crystal growth. Shlicta et al., J. Crystal Growth 174 (1997) 480–486, reported the effect of heterogeneous substrates to promote protein crystallization at lower protein supersaturation concentrations. In this study, inorganic substrates were utilized to grow protein crystals. These inorganic substrates had a far smaller unit cell than the proteins examined but gave a precise lattice match. Shlicta et al. have prepared a database for lattice-matches for the inorganic substrates tested which can help expedite the search for candidate exptiaxial substrates. Unfortunately, for this database to be useful, some structural information about the protein to be crystallized must still be known, (e.g. unit cell dimensions).

"Heterogeneous nucleants" such as are provided by some mineral surfaces, have served as efficient nucleants for a number of different proteins (McPherson et al., Crystal Growth 85 (1987) 206–214). McPherson et al. studied such minerals as apophyllite and magnesium oxide, which were capable of inducing nucleation of lysozyme, concavalin and bovine catalase. McPherson et al. (Science (1988) 238, pp. 385–387) have also investigated the heterogeneous and epitaxial nucleation of protein crystals using a combinatorial library of solid state inorganic materials having a variety of compositions of varying crystallinity and structure types. McPherson et al. demonstrat the use of heterogeneous nucleants to promote epitaxial growth of proteins. They demonstrated the heterogeneous nucleation of proteins on mineral surfaces can occur at lower levels of critical supersaturation, but that true epitaxial growth of protein on mineral crystals can also occur. They rationalized that other ordered two-dimensional arrays, as obtained from synthetic materials, might serve as nucleants as well.

McPherson et al., J. Crystal growth, 85 (1987) 206–2140, also investigated the facilitation of the growth of protein crystals by heterogeneous/epitaxial nucleation by using inorganic crystals for the nucleation of protein crystals. The four proteins crystallized were examined by vapor diffusion techniques in the presence of 50 species of inorganic crystals employed as a "combinatorial library" of different surfaces. This study demonstrated that a substantial decrease in critical supersaturation was caused by certain nucleants for some of the proteins tested which facilitated nucleation of protein crystal growth.

U.S. Pat. No. 5,869,604 discloses the use of an exogenous nucleating agent having a close lattice match to a polypeptide of interest, for nucleation and growth of high purity polypeptide crystals. In order for effective nucleation, the lattice dimensions of the crystal face of the nucleating agent must substantially match an integral multiple of a unit cell component of the polypeptide of interest. This sort of lattice matching is difficult or impossible without some structural knowledge of the polypeptide. Thus, there has been far more interest in use of non-epitaxial heterogeneous nucleants, mainly because these do not require any prior knowledge of a protein's unit cell constants.

Determining the correct conditions for crystallization of biological molecules can be labor intensive, and large quantities of biological material may be needed which may not be readily available. There have been recent efforts to develop methods for screening crystallization conditions which minimize the overall amount of biological material utilized as well as lend themselves to high throughput crystallization using picogram to microgram quantities of proteins (see, e.g., WO 00/60345). One such method allows for the screening of multiple samples simultaneously, each screening sample having picogram to microgram amounts of protein in a picoliter to nanoliter volume. These micro-chambers containing the protein may be passive, or a combination of passive micro-chambers that are connected with miniaturized active control elements such as valves, pumps and electrodes. This type of protein crystallization apparatus allows for a protein solution to be automatically dispensed into the micro-chambers, where each micro-chamber contains a slightly different crystal growth condition. Protein crystal growth in the micro-chambers is then analyzed based on both the qualitative amount of crystallization and the quality of the crystals formed. Unfortunately, use of this type of apparatus and method is labor intensive, since a different solution must be added into each micro-chamber.

The development of suitable heterogeneous substrates effective in promoting crystallization of a wide variety of proteins would provide substantial advantages in the field of protein X-ray crystallography. Any ffort at carrying out high throughput crystallization of macromolecular structures will unquestionably encounter the basic and crucial obstacle of crystallization. The other elements of the high throughput efforts, such as target selection and expression, protein purification, data collection and structure solution, have all received far more attention than the actual critical and essential crystallization event. Effective heterogeneous substrates for protein and macromolecule crystallization, however, have heretofore been unavailable.

Thus there is a need for apparatus and methods for rapid and assured crystallization of target macromolecules as well as apparatus and methods which can be automated to allow for high throughput screening of crystallization conditions for one or more molecules in parallel. There is also a need for a crystallization apparatus and methods which require minute or minimal amounts of protein for inducing nucleation. The present invention satisfies these needs, as well as others, and overcomes the deficiencies found in the background art.

SUMMARY OF THE INVENTION

The invention provides crystallization apparatus and methods which allow for the crystallization of molecules from solution, including proteins, nucleic acids, viruses or viral subunits, or other biological materials. The crystallization apparatus and methods also allow for the screening and determination of crystallization conditions with much smaller protein quantities than typically required for current screening methods. Furthermore, the crystallization apparatus and methods of the invention cause the protein molecules to crystallize in a shorter period of time than previously available crystallization techniques.

The methods and devices of the invention promote macromolecular crystal growth by heterogeneous nucleation wherein a surface or substrate surface helps concentrate, organize, or in some way order molecules so that they have a greater tendency to nucleate and become crystalline. The invention utilizes substrates for crystallization wherein a region or layer of a first nucleation catalyst material is adjacent a region or layer of a second nucleation catalyst material to define an interface therewith, with at least one of the first or second regions configured to define or provide a variation, gradient or modulation of a nucleation property of the nucleation catalyst of that region. In other words, the substrate includes at least two regions of different nucleation catalyst materials, with at least one of the regions configured to define a gradient or variation in a chemical, physical, electrical property in the nucleation catalyst in that region. The nucleation catalysts may comprise various types of organic or inorganic material, or combinations thereof. In certain embodiments, both first and second regions may be configured to provid a variation, gradient or modulation of a nucleation property in the nucleation catalyst materials of both regions.

The apparatus of the invention thus comprise, in general terms, a first region comprising a first nucleation catalyst material and a second region comprising a second nucleation catalyst material, with the first and second regions positioned adjacent to each other and configured to support at least one crystal, and with the first region having a variation in a nucleation property of the first nucleation catalyst material in the first region. The crystal may be supported at an interface of the adjacent regions. The crystal may comprise any molecule of interest, including, for example, macromolecules such as proteins, viruses, viral sub-particles, nucleic acids, nucleotides and polypeptides.

The variation in the first region allows the first region to present different crystal nucleation properties, at different portions or locations in the first region, to a solution of molecules that are to be crystallized. The variation may comprise, for example, a taper in thickness of the first region, a concentration gradient in the first region, a periodicity in the nucleation property in the first region, or a variation, modulation or gradient of any other physical, chemical, electrical or other property of a nucleation catalyst material that may effect nucleation and/or growth of crystals of molecules of interest. Where the variation is periodic in nature, the periodicity may have, for example, a dimension of between about 0.1 nanometer and about 2000 nanometers in repetition length.

The first and second regions, in certain embodiments, may be configured to support a crystal in situ during analysis of the crystal or crystals. In other words, crystals grown in association with the first and second regions may be analyzed in place, without detachment from their point of growth which would otherwise create the risk of introducing damage to the crystal. The analysis may comprise, for example x-ray or optical analysis, solid state NMR analysis, or any other analytical characterization of the crystal.

In certain embodiments, the first and second regions may include one or more crystallization wells associated therewith, with each crystallization well having at least one surface adjacent to the first region and exposed to a different portion of the variation in the nucleation property of the first nucleation catalyst material. The crystallization wells may, for example, extend through the second region such that a portion of each well is exposed to the first region.

In other embodiments, the first region may comprise a plurality of "first" layers of the first nucleation catalyst material, and the second region may comprises a plurality of "second" layers of the second nucleation catalyst material, with the layers arranged in an alternating fashion such that each second layer is interposed between a pair of adjacent first layers, with each first layer having a variation in the nucleation property of the first nucleation catalyst material. The variation comprises a taper in thickness of the first layers, a concentration gradient in the nucleation catalyst material of the first layers, a periodicity in the nucleation property in the first layers, or other variation. The periodicity may have a scale or dimension, for example, of between about 0.1 nanometer and about 2000 nanometers in repetition length. The first and second layers may be configured to support a crystal during analysis of the crystal. A plurality of crystallization wells may be included in association with the layers and extending through one or more of the first and second layers such that each crystallization well has at least one surface adjacent to at least one of the first layers and exposed to a different portion of the variation in the nucleation property of the first nucleation catalyst material.

In certain embodiments, the second region may also have a variation in a nucleation property of the second nucleation catalyst material. This variation may comprise, for example, a taper in thickness of the second region, a concentration gradient in the nucleation catalyst material of the second region, a periodicity in the nucleation property in the second region, or a variation, modulation or gradient of any other physical, chemical, electrical or other property of a nucleation catalyst material that may effect nucleation and/or growth of crystals of molecules of interest. Where the variation is periodic in nature, the periodicity may have, for example, a dimension of between about 0.1 nanometer and about 2000 nanometers in repetition length. The first and second regions may comprise alternating layers as noted above.

The methods of the invention comprise, in general terms, providing a first region of a first nucleation catalyst material and a second region of a second nucleation catalyst material adjacent said first region, with the first region having a variation in a nucleation property of the first nucleation catalyst material, exposing the first and second regions to a solution of a selected molecule, and growing at least one crystal of the molecule in association with the first and second regions. The methods may further comprise analyzing the crystal in situ with respect to the first and second regions. The methods may further comprise positioning the first and second regions to define an interface between the first and second nucleation catalyst materials. The growing of the crystal may be carried out on, proximate to, or in association with, the interface. In certain embodiments, the second region may also comprise a variation in the second nucleation catalyst material or a nucleation property thereof. In some embodiments, the first and second regions may comprise respectively a plurality of first and second layers arranged in an interleaved or alternating pattern.

In certain embodiments, the methods may comprise providing a plurality of crystallization wells extending through, or in association with, the first and second regions, such that each crystallization well has at least one surface adjacent to the first region and is exposed to a different portion of the variation or gradient in the nucleation property of the first nucleation catalyst material.

The invention also provides methods for making or fabricating a crystallization apparatus, comprising forming a first region comprising a first nucleation catalyst material, forming a second region comprising a second nucleation catalyst material adjacent to the first region, and creating a variation or gradient in the first nucleation material, or a nucleation property thereof, in the first region. The creating of the gradient may comprise creating a taper in the thickness of the first region, creating concentration gradient in the first nucleation catalyst, creating a periodicity in said nucleation property in the first region, or other form of nucleation catalyst. The periodicity may have a dimension or scale of between about 0.1 nanometer and about 2000 nanometers in repetition length. In certain embodiments, the methods may comprise creating a gradient or variation in a nucleation property of the second nucleation catalyst material in the second region.

The methods may also comprise methods of using the crystallization apparatus fabricated in the above manner, comprising exposing the first and second regions to a solution of a selected molecule, and growing at least one crystal of said selected molecule in association with said first and second regions of said substrate. The methods may further comprise analyzing the crystal in situ with respect to the first and second regions. The methods may still further comprise forming a plurality of crystallization wells in association with the first and second regions, with each crystallization well having at least one surface adjacent to the first region and exposed to a different portion of the gradient or variation in the nucleation property of the first nucleation catalyst material.

The first and second regions or layers of the apparatus and methods may be configured to provide a combinatorial array of heterogeneous nucleation sites, according to the variation, gradient or modulation of a property in one of the nucleation materials, to induce and facilitate nucleation of molecules. Each heterogeneous nucleation site of the crystallization apparatus may be comprised of organic, inorganic, biological or metallic materials as well as various combinations of these types of materials. In certain embodiments, the crystallization apparatus and methods may provide epitaxial or pseudo-epitaxial arrays with regions or portions of nucleant materials of contrasting thickness or composition which are capable of orienting the molecules targeted to be crystallized, in an orderly pattern on a specific site (nucleation site) on the surface of the crystallization apparatus, for the commencement of crystal growth.

In other embodiments, the heteronucleation substrate may comprise array of steps or variations of physical features on the substrate surface, a pattern of defects, or a variation in electrostatic surface properties of one or more nucleation catalyst materials. Nucleation is, in general, always preferred on surfaces relative to its spontaneous occurrence in bulk solution. A feature of a good heterogeneous nucleant is that its surface displays a chemical that is complementary to the molecules to be crystallized, (e.g. an electrostatic, hydrophobic/hydrophilic, or other similarity). This leads to adsorption of molecules from solution onto to the surface, and their effective concentration by restriction to a specific plane. In addition, degrees of freedom of motion for these surface associated molecules are reduced as they are constrained to translate in only two dimensions rather than three.

The crystallization apparatus or substrates, in certain embodiments, may be fabricated by using parallel or rapid serial (deposition) microfabrication methods and/or photolithography techniques to generate high density arrays of heterogeneous nucleation sites to allow for the rapid evaluation of a large number of diverse potential nucleant compositions. The invention thus provides a rapid and efficient method of screening a large number of possible nucleation surfaces with a very limited amount of protein under a wide variety of different potential crystallization conditions.

The crystallization apparatus and methods of the present invention allow for the high throughput crystallization of proteins based on the fabrication of "protein crystallization chips". Crystallization chips of the invention may comprise combinatorial arrays of continuous composition gradients, prepared by shuttering and masking and spray drying, sputter depositing, chemical vapor deposition, spin coating, dip coating, or other techniques as described below, to form layers or regions of nucleation catalyst materials. The nucleation catalyst materials may comprise inorganic, organic and/or metallic materials and mixtures and admixtures thereof. The chips or apparatus of the invention may comprise a three dimensional "psuedo-epitaxial" substrate which is presented to macromolecule solution as an array of wells on the chip, wherein the walls of the have chemically contrasting layers with a combinatorial range of periodicities or variations across a given chip, such that each well is exposed to a different aspect of a varying nucleation property or properties of the nucleation catalysts adjacent that well. These periodicities may range, for example, between about 2 and about 500 nanometers, which can induce the alignment of protein molecules into ordered arrays on the order of length scales typically found in the protein unit cells.

The heterogeneous nucleation methods of the present invention can be applied to either individual samples or samples present in an array, matrix or library format. The invention also provides processes for fabricating crystallization chips, as well as methods for inducing protein nucleation and crystal growth on the crystallization chips. The methods and apparatus of the present invention allow for the growth of a protein crystal suitable for x-ray diffraction analysis as well as other physical characteristic techniques such as NMR, AFM, optical analysis and the like, such that crystals thus grown may be analyzed in situ on the chip or apparatus, without detaching or removing the crystals from the apparatus.

One aspect of the present invention is to provide devices and methods to achieve high throughput of protein crystallography for the fields of structural biology, biotechnology, and medicine.

Another aspect of the invention is to development of nucleation catalysts for the crystallization of biological macromolecules.

Another aspect of the invention is to reduce the scale of crystallization trials by using micro fabrication technologies, thereby reducing the amount of protein required for crystallization trials.

Another aspect of the crystallization arrays of the present invention is the automation using microfluidics and MEMS technologies so that vast sequences of programmed trials will become practicable, thus making it possible to work on many proteins simultaneously.

Another aspect of the invention is the providing of crystallization apparatus fabricated so as to present a very large array of potentially attractive crystallization surfaces to a macromolecule sample solution, the surfaces serving as possible heterogeneous nucleants to initiate the crystallization.

Another aspect of the devices and methods of the invention is to increase the efficiency and speed of protein crystallization.

Another aspect of the invention is to provide efficient nucleation enhancers, based on the approaches of combinatorial chemistry, for the nucleation of protein crystals and other macromolecules.

These and other aspects, advantages, and features of the invention will become apparent to those persons skilled in the art upon reading the details of the invention as more fully described below.

BRIEF DESCRIPTION OF THE DRAWINGS

FIG. 2 is a schematic representation of a method of fabricating an apparatus with a continuous heteronucleant composition gradient through a region or layer of nucleation catalyst material in accordance with the invention, using off-axis, simultaneous deposition from two sources.

FIG. 5A–D is a schematic illustration of a method for formation of individual library elements on a continuous gradient region of nucleation catalyst material using photolithographic techniques. FIG. 5A shows the formation of a continuous gradient layer using simultaneous deposition; FIG. 5B shows a spin coat layer of photoresist followed by soft bake; FIG. 5C shows UV exposure of the photoresist through a mask, causing the exposed regions to be soluble in subsequent development steps; and FIG. 5D shows removal of exposed photoresist form previously illuminated regions. Subsequent hard baking of the photoresist gives individual library elements (wells) of different compositions in a continuous gradient, each separated by regions of hardened photoresist.

FIG. 6A–D are schematic representations of the fabrication and use of an apparatus having a two dimensional combinatorial library of two contrasting nucleation catalyst materials (e.g. hydrophobic polyisoleucine and hydrophilic polyglutamine), containing a broad range of periodicities which are on the length scale of protein unit cells. FIG. 6A and FIG. 6B show photolithography used to develop an array of photoresist posts on a substrate, with two off-axis deposition sources 180° apart, depositing gradients of nucleation catalyst on the patterned substrate. FIG. 6C shows formation of a multilayer gradient structure with embedded photoresist posts. FIG. 6D shows the structure of FIG. 6C with the photoresist removed to expose the cross section of multilayer structure in a plurality of wells.

The left column shows the formation of a Gaussian thickness profile variation from a projective deposition source that is used to generate a thickness gradient for the heteronucleant catalyst materials. The right column illustrates the use of a linear motion shutter mask with a deposition source to generate a tapered or wedge-shaped thickness profile by controlling the deposition time and location for the substrate.

FIGS. 8A–8C schematically shows an embodiment of a stacked heteronucleant combinatorial array chip with channels extending therethrough in accordance with the invention. FIG. 8A is a side elevation view of the chip, while FIG. 8B is a top front perspective view of the chip shown with photoresist defining the channels, and FIG. 8C is a top plan view of the chip shown with the photoresist removed to provide open channels through the chip.

Figure 9:
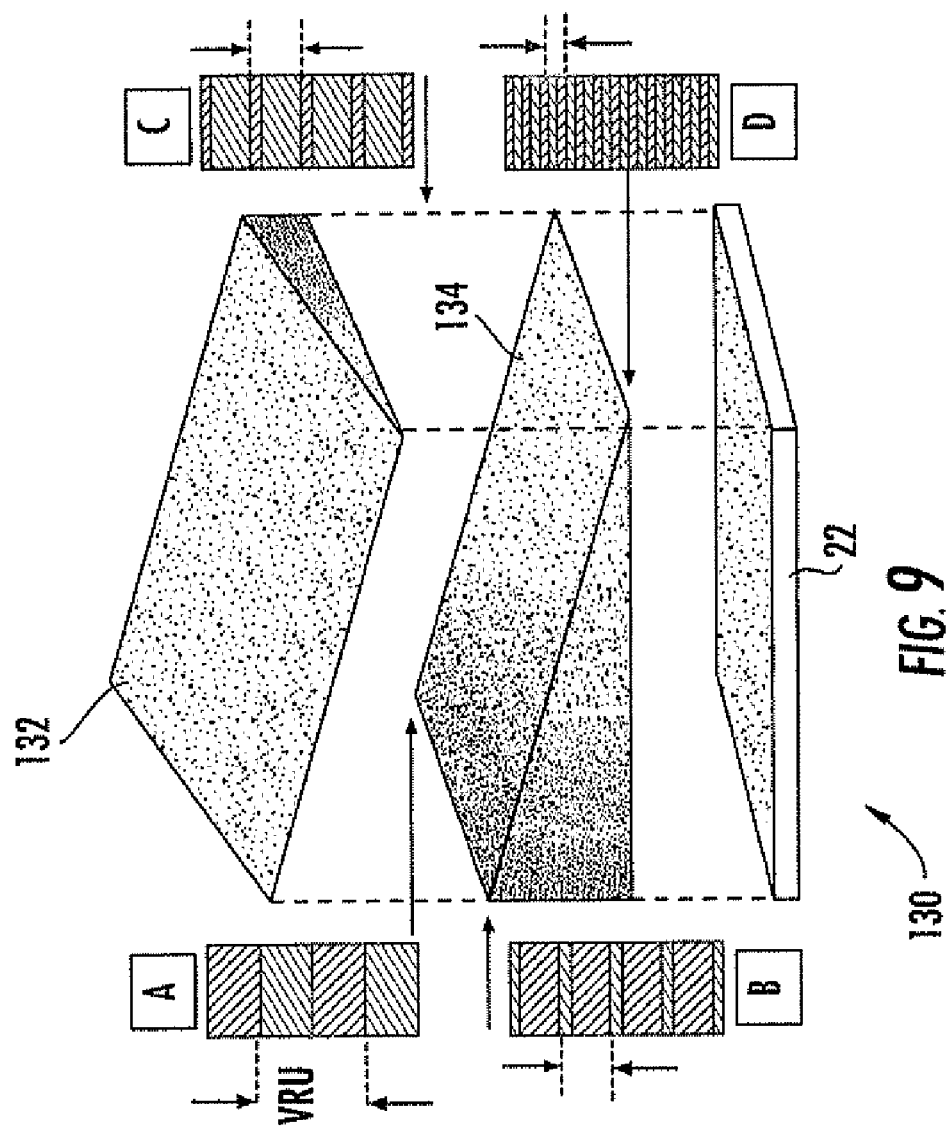

FIG. 9 is a schematic representation of a wedged, stacked heteronucleant crystallization chip in accordance with the invention made with deposition sources positioned 90° apart, to provide both concentration gradients in nucleation catalysts as well as a tapered variation in the thickness of the layers of catalyst materials. Each substrate location therefore has a difference in both the relative thickness of the two materials as well as the repetition distance of the layers perpendicular to the substrate surface relative to other locations.

Figure 10:
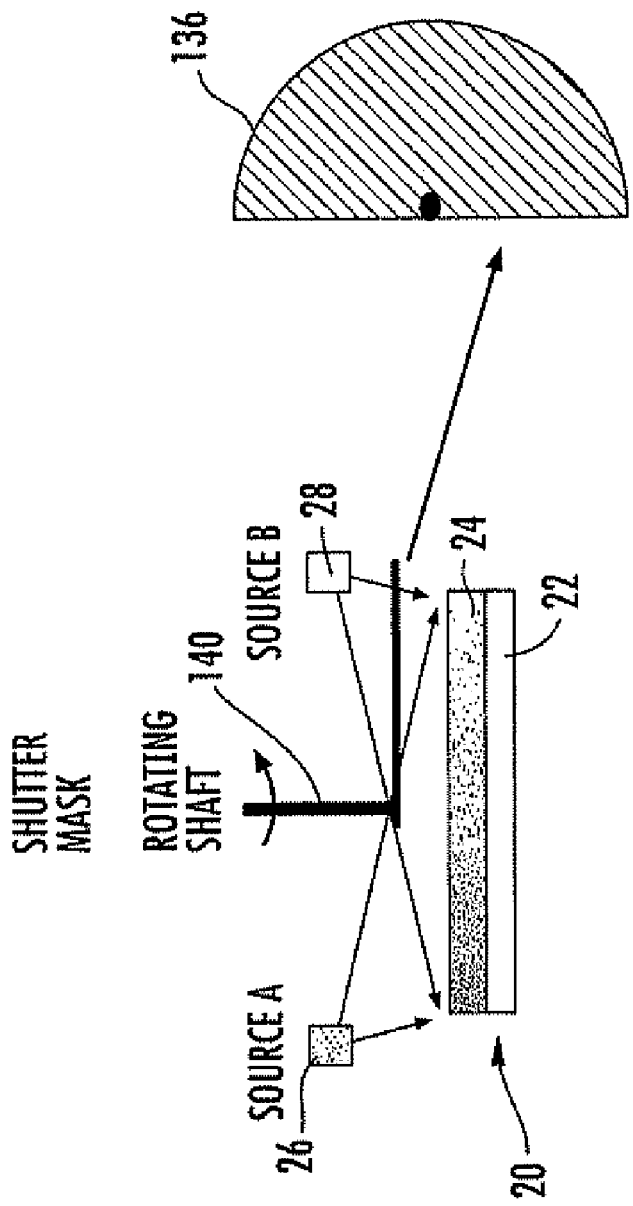

FIG. 10 is a schematic representation of an off-axis simultaneous deposition from two sources giving rise to a continuous composition heteronucleant gradient. A rotating half circle mask is used during the deposition to generate multilayer structures and block the interference from the two deposition sources.

Figure 11:
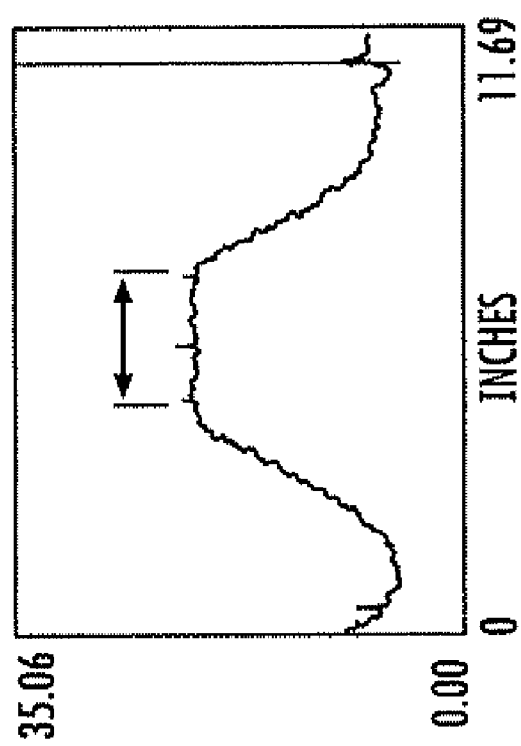

FIG. 11 is a graphical representation of a scanned profile of dye intensity across a region of paper after implementing the fabrication methods of dual source spray deposition. The flat region is the summation and overlap of two linear gradients of nucleation catalyst materials from the two sources.

Figure 12:
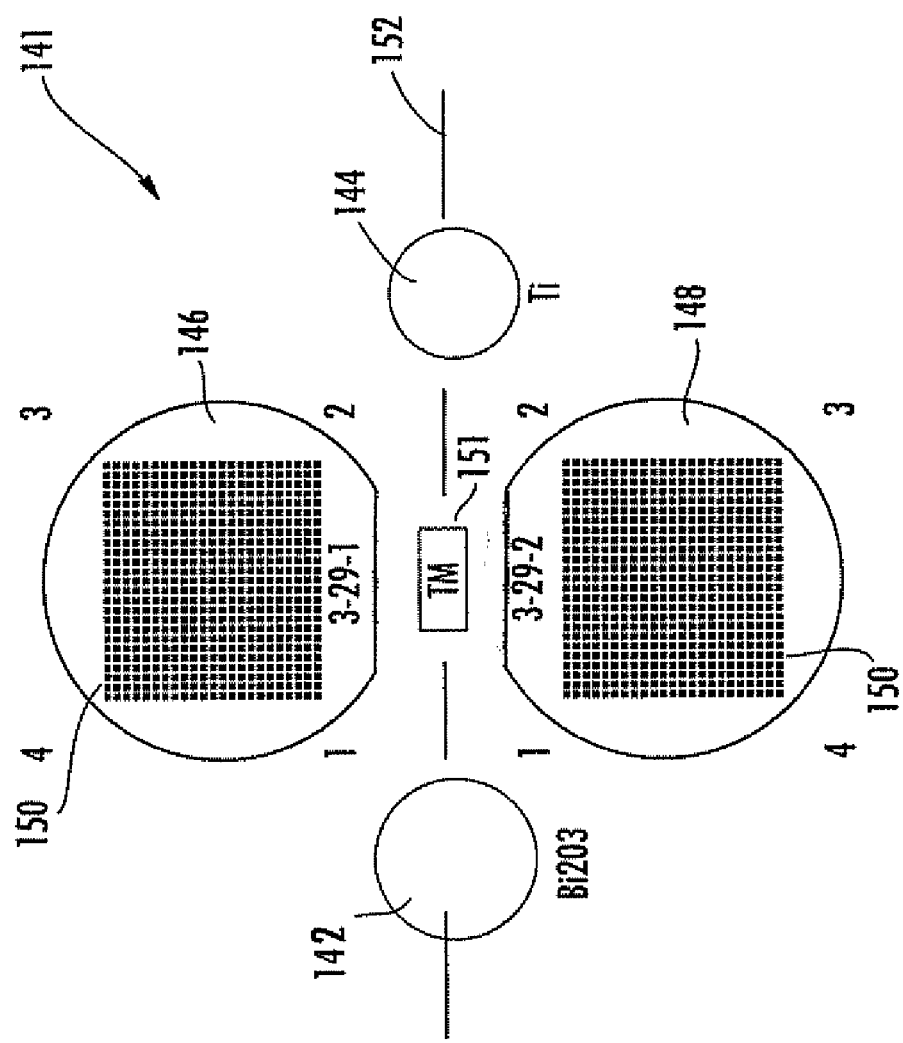

FIG. 12 is a schematic illustration one spatial arrangement of substrates relative to the deposition sources during fabrication of crystallization chips of the invention. Two duplicate wafers are shown with the deposition sources, with a thickness monitor positioned between the substrates to monitor the deposition process.

Figure 13:
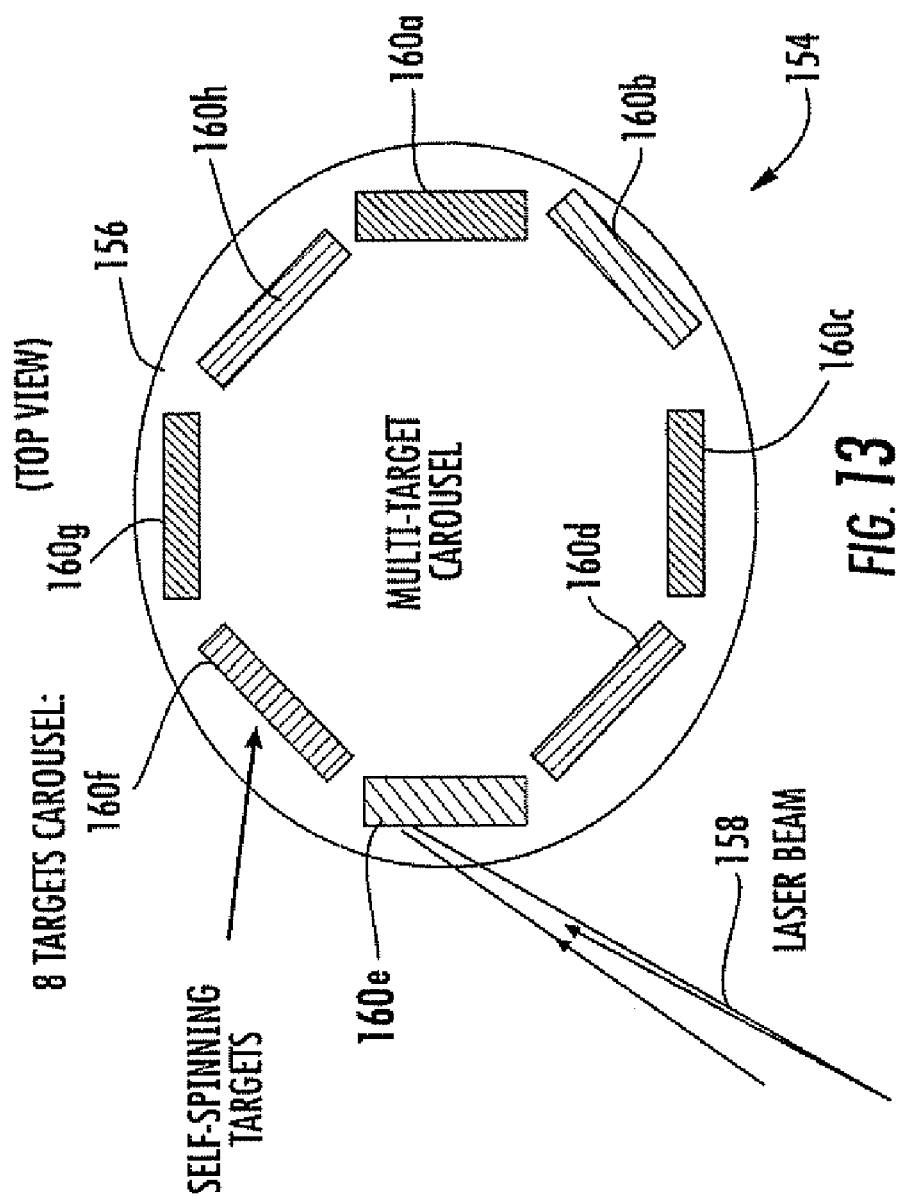

FIG. 13 is a schematic view of a pulsed laser deposition system with an 8-target carousel for in-vacuo target changing for fabricating heteronucleant library chips.

Figure 14:

FIG. 14 is a photograph of fibrous Lysozyme crystals growing on the interface of $SiO_2$ and photoresist nucleation catalyst materials.

Figure 15:
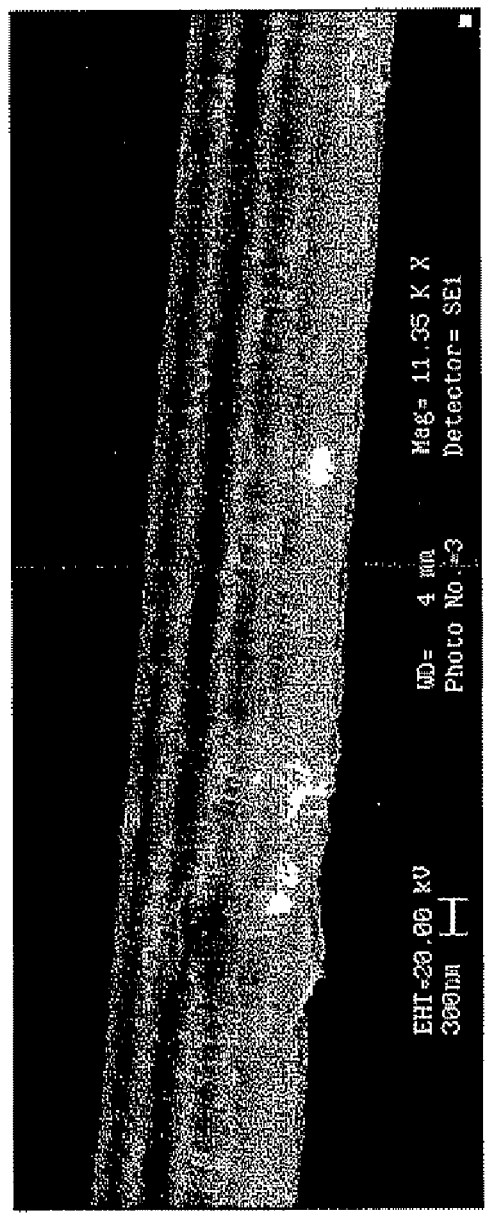

FIG. 15 is a scanning electron micrograph of the heteronucleant region (layer(s)) of a $Bi_2O_3$ —Ti metal crystallization chip viewed from an edge.

Figure 16:
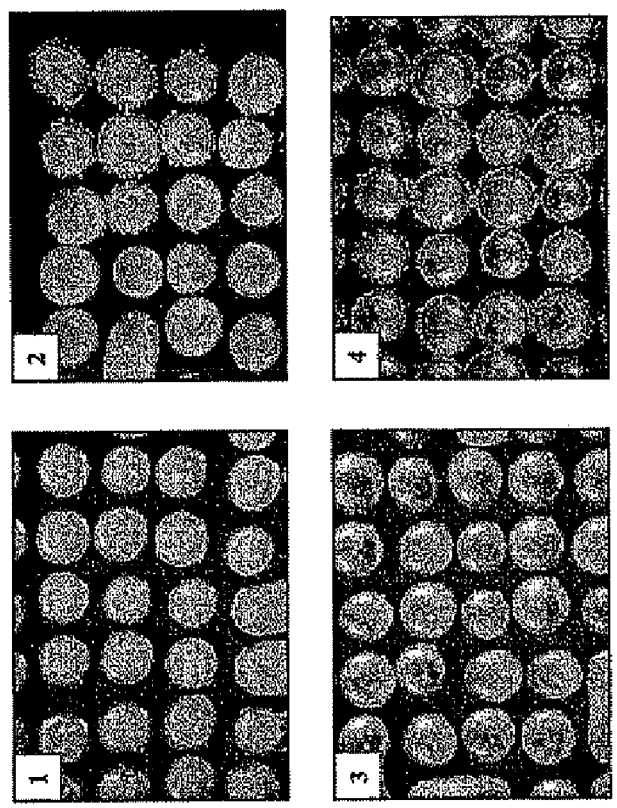

FIG. 16 shows photographs of four different regions (1–4) of the $Bi_2O_3$—Ti crystallization wafer of FIG. 15. The same lysozyme growth solution was placed into each well. The photographs 1–4 were taken at each of the four corners of the wafer after identical incubation times. Notably, there is selective lysozyme protein crystallization at specific interfacial structures, with crystal growth most pronounced in region 4 and parts of region 2, and with crystal growth less pronounced or absent in regions 1 and 3.

Figure 17:
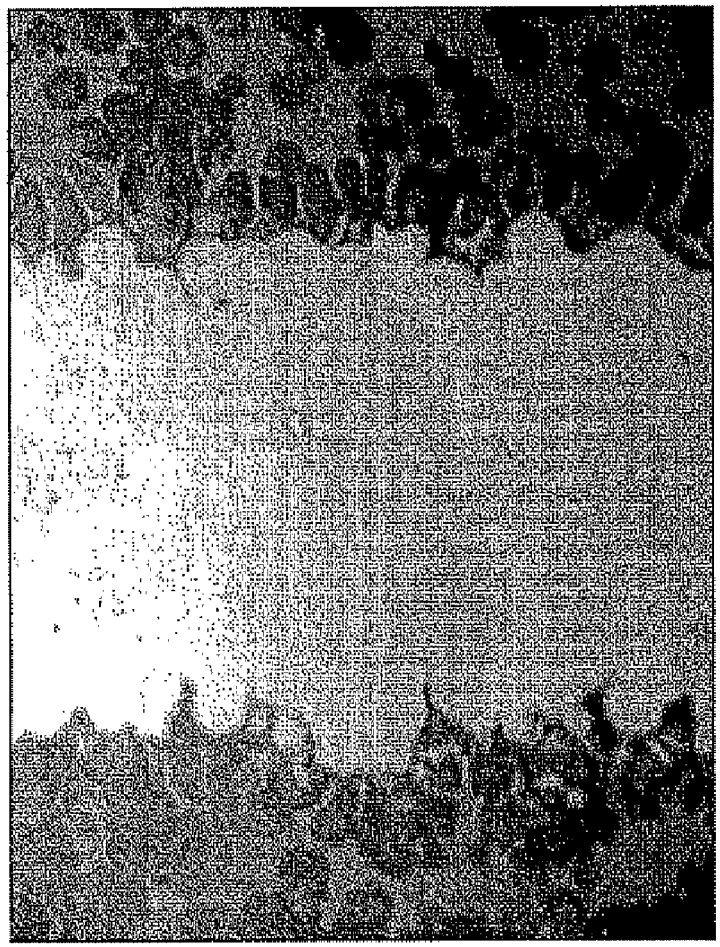

FIG. 17 is a photograph of trypsin nucleation on a stacked $TiO_2$—$MnO_2$ crystallization chip after 20 hours incubation.

Figure 18:
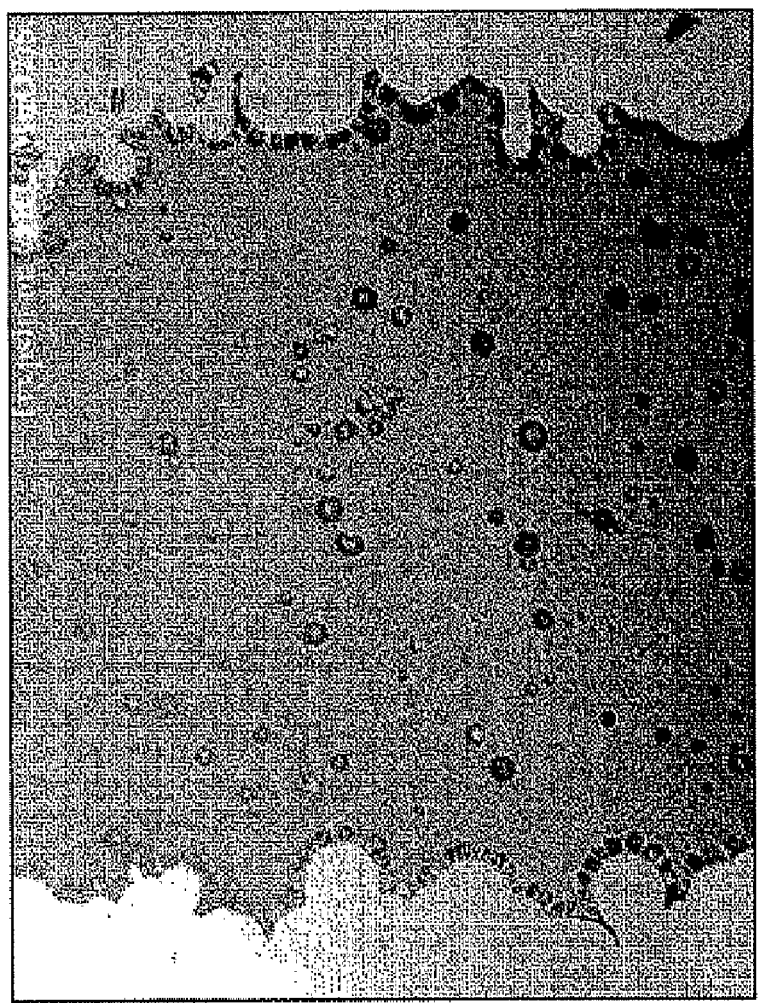

FIG. 18 is a photograph of trypsin nucleation on a stacked $TiO_2$—$MnO_2$ crystallization chip after 2 hours incubation.

Figure 19:
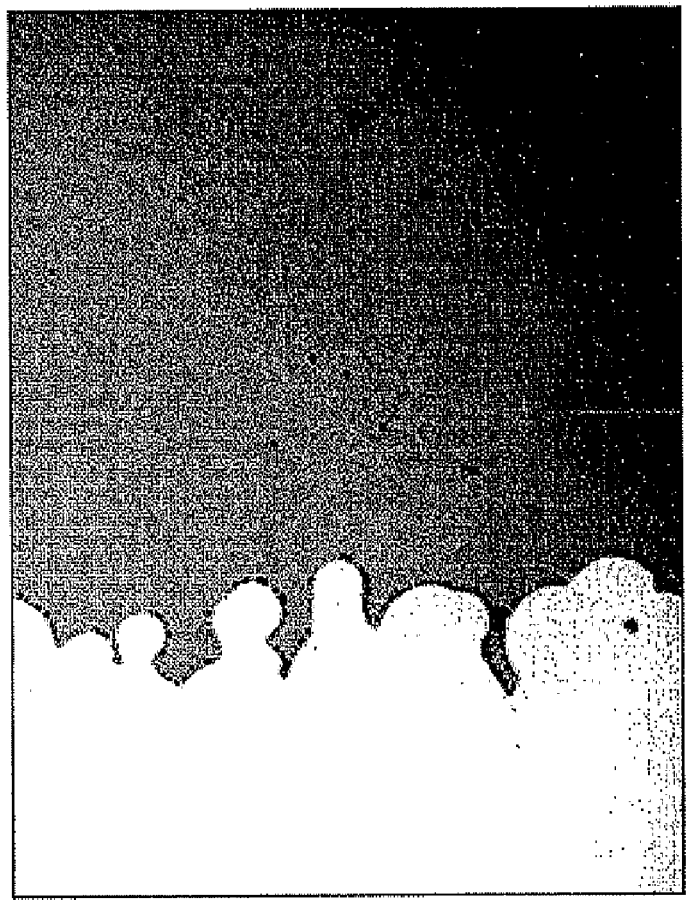

FIG. 19 is a photograph of thaumatin nucleation on a stacked TiO$_2$—MnO$_2$ crystallization chip after 2 hours incubation.

Figure 20:
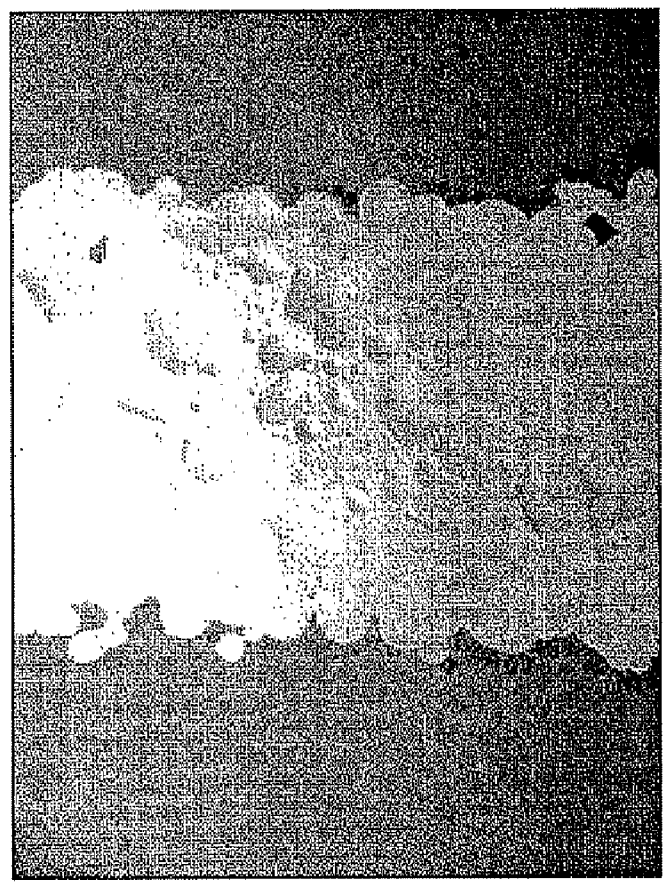

FIG. 20 is a photograph of ribonuclease nucleation on a stacked TiO$_2$—MnO$_2$ crystallization chip after 20 hours incubation.

Figure 21:
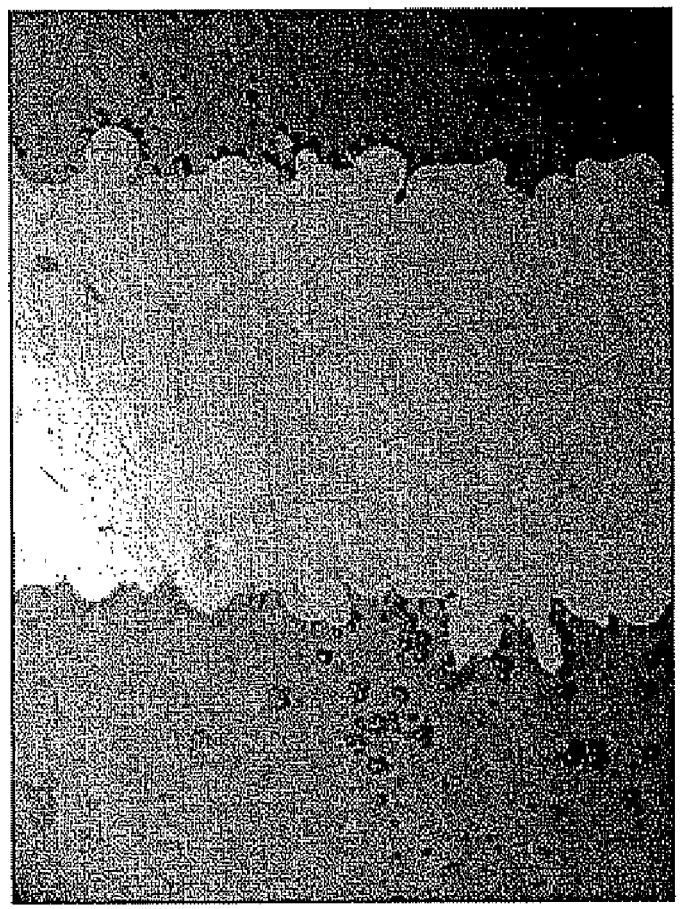

FIG. 21 is a photograph of trypsin crystals on a stacked TiO$_2$—MnO$_2$ crystallization chip after 20 hours incubation.

Figure 22:
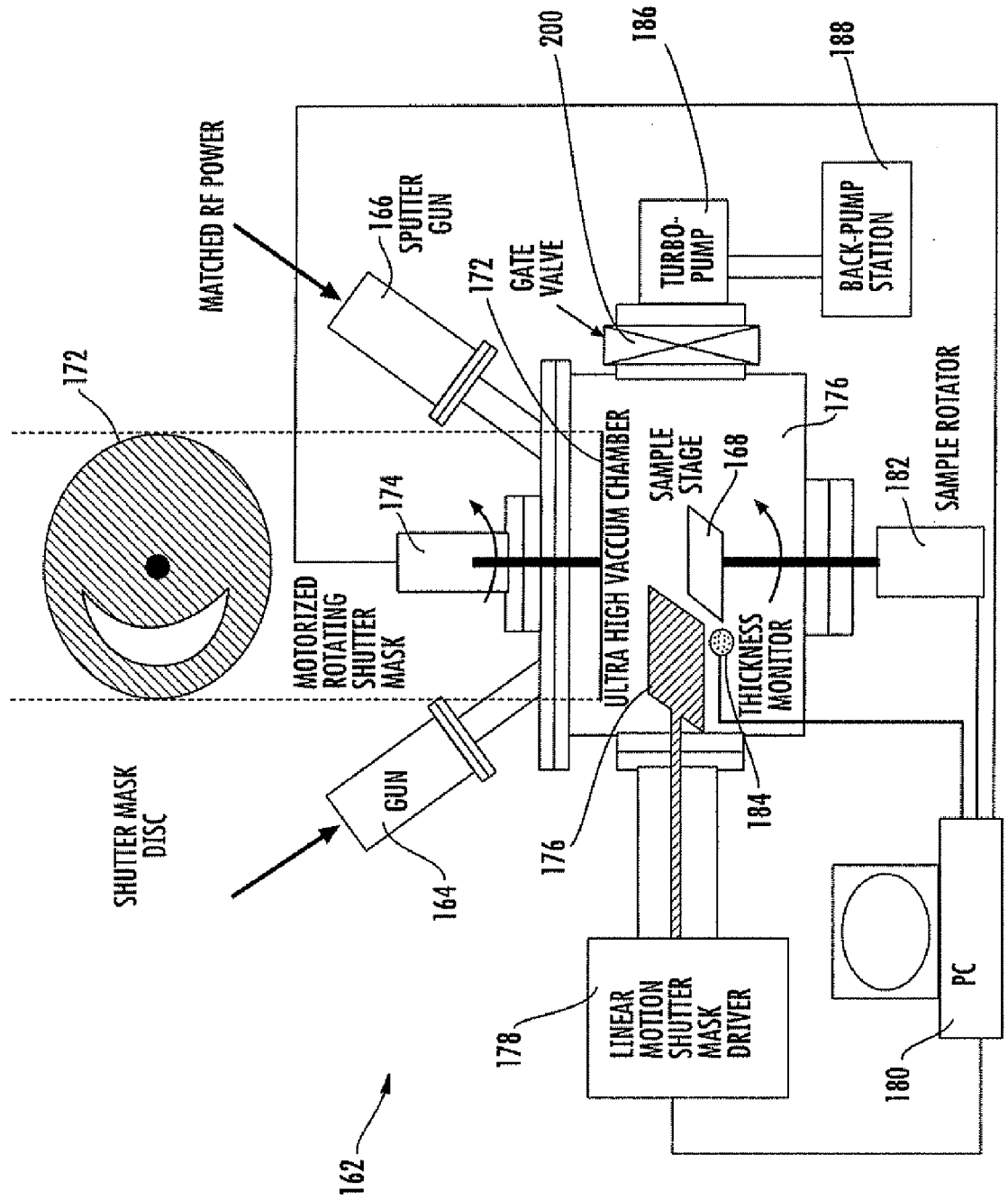

FIG. 22 as a schematic illustration of a dual source combinatorial sputtering deposition system coupled with a motorized linear mask vacuum feed-through useful in the fabrication of crystallization chips in accordance with the invention.

DETAILED DESCRIPTION OF PREFERRED EMBODIMENTS

Before the present crystallization apparatus and methods of use and fabrication are described, it is to be understood that this invention is not limited to particular embodiments described herein, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclos and describe the methods and/or materials in connection with which th publications are cited.

It should be noted that, as used herein and in the appended claims, the singular forms "a", "and", and "the" include plural referents unless the context clearly dictates otherwise. Thus, for example, reference to "a macromolecule" includes a plurality of such macromolecules and reference to "the protein" includes reference to one or more proteins and equivalents thereof known to those skilled in the art, and so forth.

The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed.

Definitions

The following definitions are provided for reason of clarity, and should not be considered as limiting. The technical and scientific terms used herein are intended to have the same meaning as commonly understood by one of ordinary skill in the art to which the invention pertains.

The term "Epitaxial nucleation" means a type of nucleation wherein the crystallographic orientation of the crystallizing material, relative to the crystallographic orientation of the substrate, is restricted to one or few possibilities by the crystallographic structure of the nucleating substrate surface. In this invention, this restricted growth orientation of the polypeptide on the nucleating surface is presumably a consequence of the ability of the periodic array of chemical groups exposed on the surface of the nucleating agent to effectively concentrate and organize the crystallizing compounds into an ordered and periodic layer. This initial restricted and organized order then is propagated in the third dimension as more and more crystallizing compounds are added by normal crystal growth mechanisms. Not wishing to be bound by theory, it is believed that nucleation of a polypeptide having a close lattice match to the nucleating agent relates to epitaxial nucleation. These terms, however, are not equivalent. Also not wishing to be bound by theory, it is also believed that a close lattice match may be a prerequisite for epitaxial crystal growth, but crystals can exhibit epitaxial growth on exogenous nucleating agents that do not have a close lattice match to the polypeptide.

The term "homoepitaxy" is defined as the growth of a crystal of the same composition and structure as the deposit.

The term "isoepitaxy" is crystal growth on a deposit of different composition but of same or closely analogous structure.

The term "orthoepitaxy" is the crystal growth on an entirely different structure but with either a precise lattice match or considerable lattice mismatch "quasiepitaxy", or no lattice match at all "pseudoepitaxy".

The term "heterogeneous nucleation" is used herein in reference to the formation of crystalline nuclei of molecules from solution on a insoluble hetero-surface surface in contact with the solution. A "heterogeneous nucleant" is a surface that facilitates formation of said nuclei.

The term "microcontact printing" means the placement of a small amount of a liquid or solution onto a surface by touching the surface to be printed with a stamp wetted with the solution.

The terms "in situ" and "in situ analysis" mean analysis that is carried out without removing the crystal or crystals from crystallization apparatus. In this manner, the risk of damage to a crystal, which may otherwise occur when a crystal is detached from a surface or point of growth, is avoided. The time required to remove and mount a plethora of crystals is eliminated. In-situ analysis may involve any analytical technique that applies to crystals. For example, in situ X-ray diffraction means that the x-ray diffraction of the crystal(s) can be obtained, measured and analyzed without removing the crystal from the crystallization apparatus, thereby abrogating the need to remove the crystal from the growing surface and also avoiding crystal mounting procedures associated with x-ray analysis. X-ray sources useful in the "in situ" analysis of crystals grown in the crystallization apparatus of the present invention include but are not limited to electron radiated X-rays from a synchrotron, intensified conventional X-ray sources from X-ray focusing devices such as X-ray phase plates or X-ray polycapillary optics. "In situ" analysis may also involve analyzing the crystal by various methods including, but not limited to, X-ray diffraction, nuclear magnetic resonance (NMR), atomic force microscope (AFM), fluorescent imaging or optical imaging techniques.

The term "nucleation catalyst material" and grammatical equivalents thereof means any solid material capable of promoting nucleation of crystals of a molecule of interest from a solution of the molecule. Previously known nucleation catalyst materials are homogeneous in the sense that they are comprised of only one material) However, the term "homogeneous nucleation" refers to the formation of crystal nuclei directly from a solution while "heterogeneous nucleation" refers to the formation of crystal nuclei on a surface in contact with a solution. Exemplary nucleation catalyst materials include, by way of example and not of limitation, inorganic materials such as $Bi_2O_3$, $TiO_2$, $MnO_2$, and $SiO_2$, metals such as Ti, Ni, Pt and Pd, and organic polymeric materials such as polymethylmethacrylate, poly-lysine and poly-aspartic acid. Numerous other nucleation catalyst materials are suitable for use with the invention and will suggest themselves to those skilled in the art.

The terms "variation" and "gradient" and grammatical equivalents thereof means any variation, gradient, modulation or periodicity of a nucleation property associated with a nucleation catalyst material or region of nucleation catalyst. The variation or gradient may be in the form of a taper or gradual variation in the nucleation property, or in the form of a periodic modulation in th nucleation property. A variation or gradient may comprise, for example, a thickness gradient or taper in the thickness in a layer or region of a nucleation catalyst material. A variation or gradient may also comprise a gradient in the concentration of different chemical species present in a region or layer of nucleation catalyst material. The variation or gradient may be localized, as in the case of a periodic modulation of the nucleation property, or may extend across the entire region or layer of the nucleation catalyst material. The gradient or variation may be linear or non-linear in nature.

The term "nucleation property" and grammatical equivalents may comprise any material or physical property in a nucleation catalyst that can effect or promote crystal nucleation and growth. Exemplary nucleation properties include, by way of example, a physical or dimensional property of a region or layer of nucleation catalyst, a chemical or compositional property of the nucleation catalyst, a textural property associated with a surface or surfaces of the nucleation catalyst, hydrogen bonding, ionic bonding, , electrostatic interaction, or Van der Waals forces associated with a nucleation catalyst material, or any other physical, chemical or electrical property that may have an effect on crystal nucleation.

The term "periodicity" of a surface is used herein to refer to a surface that has at least two spatial repetitions of contrasting nucleation properties.

Overview of Invention

The crystallization apparatus and methods of the invention utilize nucleation catalyst materials capable of crystallizing molecules such as proteins, nucleic acids (nucleotides), viruses, viral sub-particles, or other biological materials. The nucleation catalyst materials may be heterogeneous nucleants present in the form of hetero-structures or adjacent regions or layers of inorganics, organics, ceramics, polymers, metals and mixtures or hybrids of these compounds or other similar compounds. The individual regions of the hetero-nucleants can be either crystalline or amorphous, or both, in structure. The hetero-nucleant structures induce, facilitate and/or improve the nucleation and/or crystal growth of molecules of interest, and macromolecules in particular.

The invention also provides methods for the fabrication of the crystallization apparatus as well as methods of growing crystals of macromolecules utilizing the disclosed crystallization apparatus. The present invention allows the collection of x-ray diffraction data directly on the crystals within the apparatus in which they were grown. The invention is described primarily in terms of use for crystallization of macromolecules, and proteins in particular. However, the invention may be used for crystallization of any molecules of interest via solution growth, melt growth, sublimation growth, or other crystallization technique.

Crystallization Apparatus

In general, the crystallization apparatus or chips of the invention may be manufactured using any method or technique suitable for formation of regions or layers of materials usable for nucleation of crystals. Such techniques include conventional lithographic and microfabrication techniques, spray deposition, sputter deposition, vapor deposition, molecular beam epitaxy, laser ablation, electron beam or thermal evaporation, electrochemical deposition, molecular self-assembly, microcontact printing methods, stamping, embossing, silk screening, etching, spin coating, dip coating, sol gel coating, thermal or methods, and other techniques, which will necessarily vary according to the particular crystal nucleation catalyst materials used to form the apparatus. The fabrication methods described herein are only meant to be illustrative, and other physical and chemical methods of fabricating the heterogeneous nucleant crystallization chips can be utilized, as will be apparent to those skilled in the art.

The crystallization chips, in certain embodiments, are fabricated by using parallel or rapid serial (deposition) microfabrication methods and photolithography techniques to generate high density arrays of distinct heterogeneous nucleant compositions. Various heteronucleant composition gradients or variations, both continuous and dis-continuous (periodic or non-periodic), linear or non-linear, may be fabricated to provide a plurality of unique heterogeneous nucleant compositions throughout the chip. The heterogeneous nucleant compositions may be present on the surfaces of crystallization wells present in the chip, or on other features or surfaces of the chip. The density of the distinct heterogeneous nucleant compositions on the chip may range, for example, from about 2 sites/cm$^2$ to about 10,000 sites/cm$^2$, also about 10 sites/cm$^2$ to about 1000 sites/cm$^2$, also about 50 sites/cm$^2$ to about 500 sites/cm$^2$, and also about 80 sites/cm$^2$ to about 200 sites/cm$^2$.

In certain embodiments, a combination of ultrasonic nebulization and spray drying methods may be utilized in the manufacturing of the crystallization apparatus. These methodologies allow for an extremely versatile, low temperature synthetic route to the fabrication of heterogeneous nucleation chips that provide combinatorial libraries of different nucleation properties of nucleation catalyst materials. The use of an ultrasonic spray head allows for the deposition of a nucleants as a fine, collimated spray consisting of droplets (the droplets in certain embodiments may be centered around about 5–50 μ in size, and in some instances about 15–20 μ in size at room temperature), directed toward a warm chip support substrate where rapid evaporation leaves a thin film of the heteronucleant solute.

Figure 1:
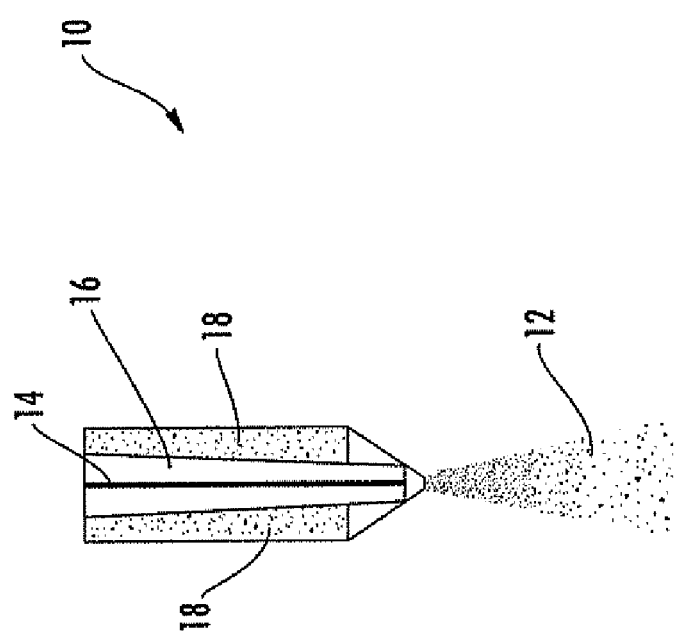
FIG. 1 is a schematic representation of an ultrasonic spray head usable in manufacturing crystallization apparatus in accordance with the invention.

Referring to FIG. 1, there is shown a schematic representation of a commercially available ultrasonic spray head device 10 generating a nucleation catalyst precursor mist 12 from a precursor liquid 14 introduced into a Ti alloy horn 16, which is driven by surrounding piezoelectric transducers 18. In example of an ultrasonic spray device useful in the fabrication of a crystallization chip is one which produces about 1 watt of power at a frequency of about 150–200 kHz. These conditions sufficiently nebulize flow volumes (delivered by syringe pumps) to between 0.05 and 25 mL/min. A focusing air shroud shapes and collimates the spray to the desired geometry.

The spray dry apparatus 10 may be utilized as the deposition source to deposit films, layers or regions of nucleation catalyst materials which provide the active component(s) of the heterogeneous nucleation sites on the crystallization chips of the invention. The spray dry apparatus 10 allows for the production of chips with, inter alia, a structure of discrete layers of heteronucleant(s), chips with continuous composition gradients of nucleation catalyst materials, and other structures. This method of fabrication allows for any liquid precursor for a nucleation catalyst material or materials, even colloids up to 40 wt %, to be delivered without heating the solution, and also allows for the formation of heteronucleant layers or regions of arbitrary thickness by depositing heteronucleant solutions of various concentrations. For example, deposition of 0.1 mL of a $10^{-3}$ M solution with a solute of molecular weight 100 g/mol over a 1 cm² chip support area, gives a deposit with a thickness of approximately 150 nanometers.

In certain embodiments, spray dry apparatus 10 may be utilized to manufacture a chip comprising a continuous linear gradient of two components by employing the simultaneous discharge of two heteronucleant precursor solutions. Referring now to FIG. 2, there is shown a schematic representation of the formation of a crystallization apparatus 20 comprising a support or substrate 22 and a region or layer 24 of nucleation catalyst material having a continuous composition gradient of two nucleant components A (dark) and B (light). Substrate 22 may comprise, silicon, glass, organic polymer or any like substrate material, and the nucleant components may comprise various nucleation catalyst materials as shown in the Examples below. Sources 26, 28 may comprise a spray deposition device like the apparatus 10 of FIG. 1 or another deposition source such as a sputtering or laser ablation target or chemical vapor deposition source.

The two components A, B are provided by source 26 and source 28 respectively, using off-axis (direction of deposition not perpendicular to substrate plane), simultaneous despostion of the two nucleant materials A and B from precursor liquids or solutions (not shown) from a spray dry system of the type shown in FIG. 1, or other deposition source, such that end 30 of layer 24 comprises pure or substantially pure A, and end 32 of layer 24 comprises pure or substantially pure B, and with the middle portion of layer having approximately 50% of A and 50% of B. The evaluation of the thickness of the deposition of region 24 after evaporation of the droplets raining on a warm support surface 22, has indicated that droplets with diameter of about 10 μ for a heteronucleant precursor concentration of $10^{-3}$ M in solution, can give a deposit of about approximately 7 Å thickness over an area of 80μ². The solution concentration and droplet size sprayed onto substrate 22 may of course vary with different embodiments of the invention.

The apparatus 20 provides a variation or gradient in chemical or compositional property across the length of region 24, and the surfaces of region 24, at different locations on region 24, will have present different portions or parts of the gradient defined by the varying ratio of nucleant A and nucleant B. That is, different portions of layer have different amounts of A and B present, and surfaces of layer 24 adjacent to those portions will differing nucleation properties due to the different amounts of the A and B materials present in layer 24. One or more such portions of layer 24 can provide an optimal nucleation property, in the form of an optimal compositional ratio of A to B, to promote crystal nucleation, as described further below.

In other embodiments, crystallization apparatus with a structure of discrete heteronucleant layers may be fabricated by the sequential (stacked) deposition of a plurality of components (e.g. at least two, but in some cases three, four, five or more different heteronucleant components). The deposition may be carried out using any of the material deposition techniques discussed above, and the deposition conditions and layer profiles may be calibrated from scanning electron microscopy (SEM) measurements, ellipsometry, or other layer characterization method.

Figure 3B:
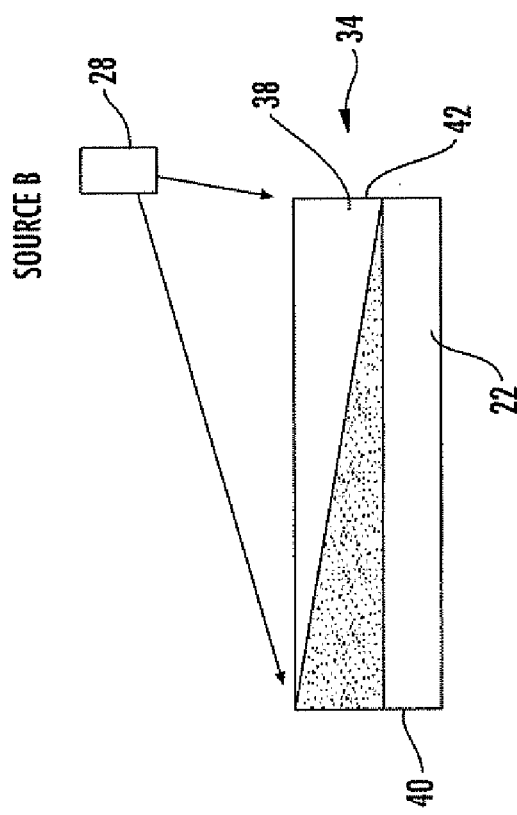
FIG. 3 is a schematic representation of a method of sequential deposition of nucleation catalyst materials from two sources, to provide a stacked or layered heteronucleant crystallization apparatus with discrete composition and thickness gradients in accordance with the invention.
Figure 3A:
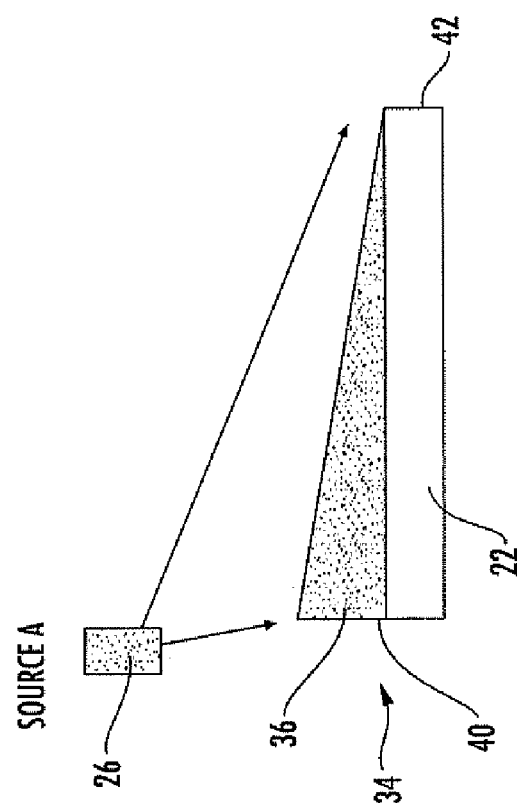

FIG. 3A and 3B schematically illustrate the formation a crystallization apparatus 34, with like reference numbers used to denote like parts. In the apparatus 34, a first layer 36 of a first nucleation catalyst material A (dark) is deposited onto base 22 by source 26, as shown in FIG. 3A, and a second layer 38 of a second nucleation catalyst material B (light) is deposited on first layer 36 by source 28 (FIG. 3B). Layers 36, 38 each have a variation or gradient in thickness in the form of a taper, with layer 36 decreasing in thickness from end 40 to end 42 of the apparatus 34, and with layer 38 increasing in thickness from end 40 to end 42. The taper in thickness of layers 36, 38 is provided by positioning of sources 26 off-center or asymmetrically with respect to substrate 22. Multiple additional tapered layers (not shown) of nucleant materials A and B may also be deposited, as described further below. The thickness of layers 36, 38 may range, for example, from between about 0.1 nanometer and about 2000 nanometers. In some embodiments, layer thickness may range from between about 10 nanometers to about 100 nanometers.

The different physical thickness of layers 36, 38 in different portions or locations of the apparatus 34 provide a different nucleation property (in the form of differing layer thicknesses) to molecules when the apparatus is exposed to a solution of molecules for growth of crystals thereof as described below. The relative thickness of layers 36, 38 and substrate 22, and the degree of taper or thickness gradient in layers 36, 38, is exaggerated in FIG. 3A and FIG. 3B for reason of clarity, and layers 36, 38 and substrate 22 are not necessarily shown to scale. The sequential or stacked layer synthesis of FIG. 3A and FIG. 3B can be arbitrarily extended to higher dimensionality by the deposition of three or more different nucleant materials, if desired.

Figure 4:
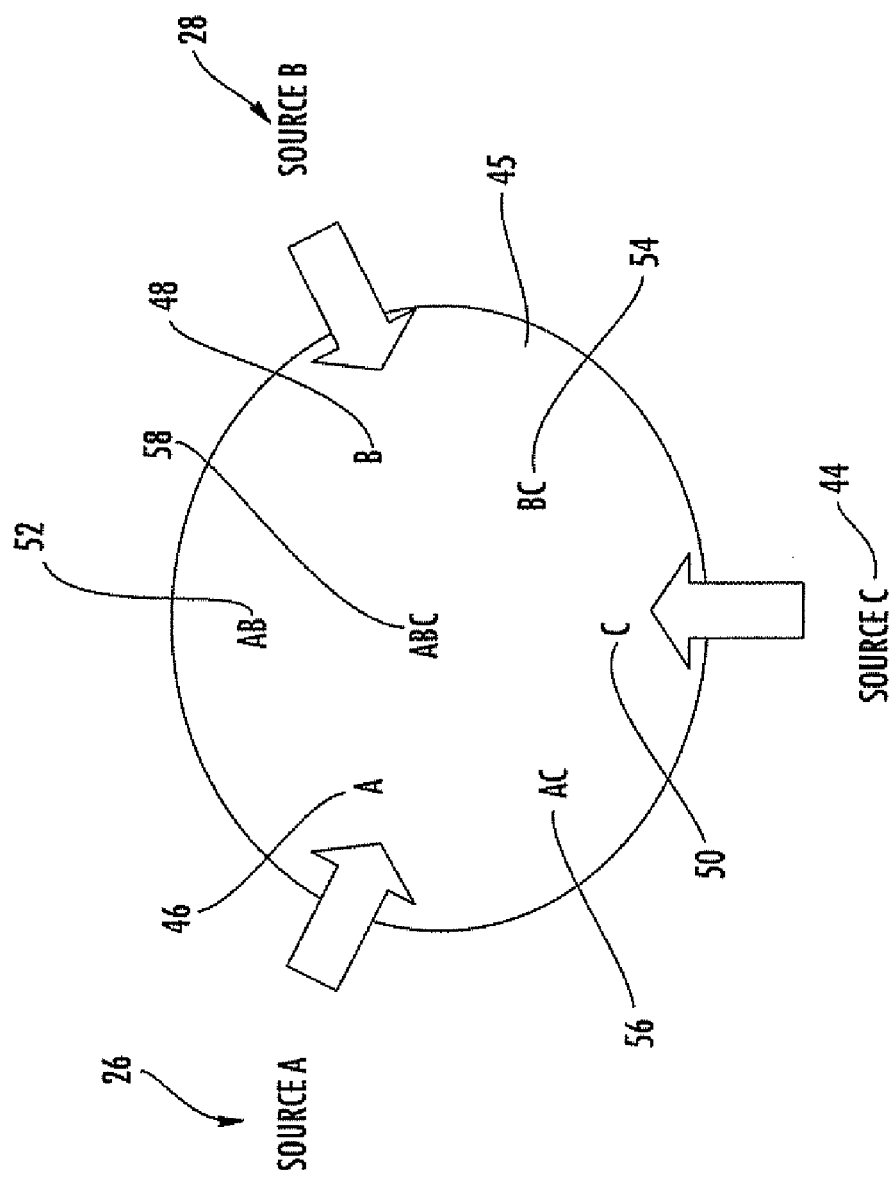
FIG. 4 is a schematic illustration of fabricating an apparatus in accordance with the invention wherein composition gradients result from the deposition of nucleation catalyst materials from three off-axis sources.

Referring to FIG. 4, there is shown schematically the use of three simultaneously discharging sources 26, 28, 44 onto a base or substrate (not shown) to allow fabrication of crystallization apparatus with three heteronucleant materials A, B, C. Simultaneous deposition of nucleant materials A, B C from sources 26, 28, 44 can provide a single layer 45 that varies in percent composition of materials A, B and C across the layer 46. Thus, for example, portion 46 of layer 45, which is adjacent source 26, comprises pure or substantially pure material A, while portion 48 adjacent source 28 comprises pure or substantially pure material B, and portion C adjacent source 44 comprises pure or substantially pure material C. In a similar manner, portion 52, which is located somewhat between sources 26 and 28 but remote from source 44 will substantially comprise a mixture of materials A and B, with little or no material C present. Portion 54 between sources 28, 44 and remote from source 26 comprises mostly or entirely materials B and C with little or no material A, and portion 56 between sources 26 and 44 comprises materials A and B with little or no material C present Finally, portion 52, which is equidistant from sources 26, 28, 44, comprises all three nucleant materials A, B and C.

Using the three sources 26, 28, 44 of FIG. 4, a structure of tapered layers (not shown) of materials A, B and C may be formed by sequential, rather than simultaneous, deposition of materials A, B and C from sources 26, 28, 44. Thus, for example, material A may be first applied to the substrate to create a layer of material A that is tapered in thickness from the portion 46 adjacent source 26 towards portion 54, which is opposite or remote from source 26. Subsequent deposition of material B from source 28 results in a layer of material B tapered in thickness from portion 48 towards portion 56, and deposition of material C from source 44 results in a layer of material C that is tapered in thickness from portion 50 towards portion 52. By controlling the sequence or order of deposition from sources 26, 28, 44 and the position of the substrate during deposition, a large number of different layer structures of nucleant materials A, B and C may be formed.

Using the method of deposition depicted in FIG. 4, three inorganic oxide precursors (or colloidal dispersions) as nucleant materials A, B, and C may be deposited onto a chip support made from materials such as silicon, quartz, glass, an organic polymer or the like. Appropriate nucleant precursors for fabricating the crystallization chip with inorganic oxide nucleants include ammonium salts of polyanions, metal nitrates, metal acetates, alkoxides or alkali or alkaline earth salts of either main group or transition elements which, upon firing to >500–600° C. or other suitable temperature, yield the corresponding metal oxides. The fabrication of metal oxide layers in this manner is well known in the art. In one embodiment, the chip may be fabricated by the codeposition of an alkaline earth cation (e.g. $Mg(CH_3CO_2)_2$), a transition element metal nitrate (e.g. $Fe(NO_3)_2$), and colloidal $SiO_2$ material. After firing, the chip would provide MgO, $Fe_2O_3$, $SiO_2$, $MgFe_2O_4$, $MgSiO_3$, $Fe_2SiO_4$ and/or $MgFe_2SiO_6$ nucleation catalyst materials as well as nucleation catalyst materials derived from the physical and chemical mixtures of these components. Some nucleant precursor metal salts useful in the fabrication of the crystallization chips of the invention are shown in TABLE 1. The nucleant precursors listed in TABLE 1 are exemplary only and are not meant to be limiting in any way.

The three sources 26, 28, 44 of FIG. 4 are shown as being approximately 120° apart from each other with respect to the plane defined by the substrate and deposited layer 45. In other embodiments, sources 26, 28 may be 180° apart (on opposite sides of the substrate), 90° apart, or other angular relationship.

Chips manufactured with a plurality of nucleants can provide a larger number of distinct S compositional regions than chip made from two components. For example, if ternary mixtures of the compounds listed in TABLE 1 are utilized in fabricating a chip, the chip may comprise of hundreds or thousands of small regions or portions of various compound mixtures across the surface and depth of the chip. Each small region of the chip has a different chemical makeup, giving a huge number of compositions per chip surface for potential use in crystal nucleation. This allows for the testing of a large variety of chemical compositions on a chip for inducing crystal nucleation. The choice of nucleants utilized in the fabrication of chips will vary according to the molecules of interest to be crystallized and other factors such as chip processing conditions (e.g. heating rates and times) for a given mixture of compositions may also be considered in the fabrication of crystallization chips.

TABLE 1

| Transition elements | Alkali or alkaline/rare earth | Main group | Colloids |
|---|---|---|---|
| Nitrates, acetates, sulfates: Fe, Cr, Mn, Co, Ni, Cu, Zn, Pd, Ag, Cd, Hg | Nitrates, acetates: Na, K, Rb, Cs, Mg, Ca, Sr, Ba, Y, La, Gd, Eu | Oxyacids, nitrates, acetates, sulfates: B, Al, Ge, Sn, Pb, P, Sb, Se, Te | metals: Ag, Au, Pt, Ni, Rh oxides: Zr, Hf, Nb, Ta, Mo, W, Sn, Pb |

Before or after the deposition of the nucleant(s) of interest onto the wafer chip, in certain embodiments, the chip may be treated using simple photolithographic techniques to (a) isolate and define individual crystallization sites on a chip and (b) create crystallization wells which can hold very small volumes of solution of a macromolecule to be crystallized. Each such crystallization well is positioned in association with a different heterogeneous nucleation site on the chip that has a different nucleation property due to the different variations or gradients in composition or structure of the chip at that site. This procedure limits indiscriminate nucleation over the entire chip and defines specific compositional regions responsible for nucleation. In some embodiments, however, crystallization apparatus without crystallization wells therein may be used for crystal nucleation.

FIG. 5A–D illustrates the method of forming a crystallization chip 60 (FIG. 5D) with individual nucleation elements (regions) on a continuous gradient chip, with like reference numbers used to denote like parts. FIG. 5A depicts the continuous deposition of three nucleant materials from three sources to form layer 45 on substrate 22. Only two of the three sources (26, 28) are shown for reason of clarity.

FIG. 5B shows the application of a positive photoresist layer 62 on top of the heteronucleant continuous gradient layer 45. The photoresist layer 62 may be applied by placing a photoresist solution onto layer 45 (which may already be coated and fired to give an oxide surface thereto) and rapidly spinning the substrate 22 and layer 24 in a spin coater (not shown). The thickness of photoresist layer 62 is controlled for a given viscosity solution by the rat and time of spinning (typically a minute at several thousand rpm) in a conventional manner. In general, the positive photoresist 42 is spin coated to a depth of approximately about ~15μ. The chip (wafer) is "soft-baked" at 90° C. to give a firm coating.

After application of the photoresist coating 62, a photomask 64 (with the desired design easily made by AutoCad™ software) is prepared, and photoresist layer 62 is illuminated in a mask aligner (not shown) with UW light as depicted in FIG. 5C. For positive photoresist 62, the LV treatment causes polymer bond cleavage in the illuminated regions such that the exposed portions of photoresist layer 62 dissolve away in a subsequent development step, leaving the pattern of mask 64 imprinted on photoresist layer 62. Techniques useful in mask design, forming the photoresist layer 62, UV illumination and development of UW treated photoresists are well known techniques to those skilled in the art.

Once the development of the photoresist layer 62 is completed, there is left an array or library of crystallization wells 66 on the surface of layer 45 of apparatus 60, as shown in FIG. 5D. The bottom surface of each well 66 is adjacent to a different part of the chemical or composition variation or gradient defined across layer 45 by the differing compositions of nucleants present in layer 45, such that each well 66 is adjacent to or associated with a different nucleation property. The apparatus may be further heated to irreversibly crosslink and harden the remaining portions of photoresist 62 which define wells 66.

The photoresist 62 thus provides regions of a hydrophobic material which separates the individual wells 46. In this regard, the photoresist regions 62 of FIG. 5B may be considered as a second nucleation material adjacent the layer 45, with interfaces 68 defined between photoresist regions 62 and layer 45. In certain embodiments, crystal nucleation of molecules, from solutions (not shown) present in wells 66, may preferentially occur at or proximate to interfaces 68. It should be noted that photoresist 62 may be a negative photoresist instead of positive, and the aforementioned procedure may be modified accordingly to use a negative photoresist.

Crystals grown in wells 66 may be analyzed in situ on the apparatus, without detaching or removing the crystals from wells. This prevents potential damage to crystals which may otherwise occur. Substantial time savings result from the ability to scan and screen all crystals directly in the apparatus in which they were grown as opposed to separately mounting and examining the crystals individually. The size of the wells 66 may vary depending on the type of crystallization chip desired. The size of wells 66 is not limited by the lithographic fabrication of the apparatus 60, but by the amount or volume of the macromolecular solution necessary to produce a detectable crystal. When using synchrotron X-radiation to analyze a crystal on the chip 60 to detect large unit cell patterns, a chip with an extremely high density array of wells 66 may be employed. The x-ray beam can be focused onto a well 66 that would be of insufficient volume to contain enough protein to grow a crystal of diffractable size. Thus, the array density is defined by the amount of material (i.e., crystal size) that can be grown from the contained volume in a well.

Various chip designs other than those described above, may be used with the invention. In one embodiment, for example, chips are based on having a plurality of wells within multilayer stacks of nucleant material, with repeating periodicities, that combinatorially span a range of distances that encompass the range of length scales (typically from about 50 to about 1500 Å) that would include macromolecular (e.g. protein) unit cell lengths or dimensions.

A chip may be fabricated to have multiple layers of nucleant materials that vary in nucleation properties, so that wells can be formed which have distinct nucleation property characteristics, and such that a certain well or wells will allow a macromolecular molecule such as a protein to be preferentially bound to the nucleant layers associated with that particular well. If the nucleant layers adjacent the surface of a particular well comprise, for example the correct periodicity for the size of the macromolecule (i.e., define a substantial lattice match with unit cell feature of the macromolecule), then the macromolecule is more likely to align with the nucleation material on the well surface.

One method of fabrication of a stacked, wedged heteronucleant crystallization chip in accordance with the invention is shown schematically in FIG. 6A through FIG. 6C. Once again, it should be kept in mind that the various components and dimensions shown in FIG. 6, as well as elsewhere, are not necessarily shown to scale. In FIG. 6A, a photoresist layer 70 is coated onto a substrate 22, followed by UV irradiation through mask 74 to create exposed portions 76 in photoresist layer 70. The photoresist layer 70 is then developed to remove the exposed portions 76 thereof and leave a plurality of photoresist "posts" or columns 78 as shown in FIG. 6B (photoresist posts 78 in FIG. 6B are not shown to the same scale as developed regions 76 in FIG. 2A). The photoresist layer 70 may be approximately 1–5μ thick, with posts 78 separated by about 500μ.

As also shown in FIG. 6B, two nucleant materials A and B, with different, chemically contrasting nucleant compositions, are sequentially deposited from sources 26 and 28, in an off (perpendicular) axis geometry or arrangement, to give the stacked wedge geometry or configuration to layers 80, 82 of nucleant materials A, B in the manner described above. It should be noted that the size of photoresist posts 78, and the distances of sources 26, 28 with respect to posts 78 and substrate 22, are not shown to scale. Multiple additional tapered layers 80, 82 are also applied in the same manner, to provide the multilayer stack 86 structure of FIG. 6C, wherein photoresist posts 78 extend through several alternating layers 80, 82 of nucleant materials A, B.

Figure 6D:
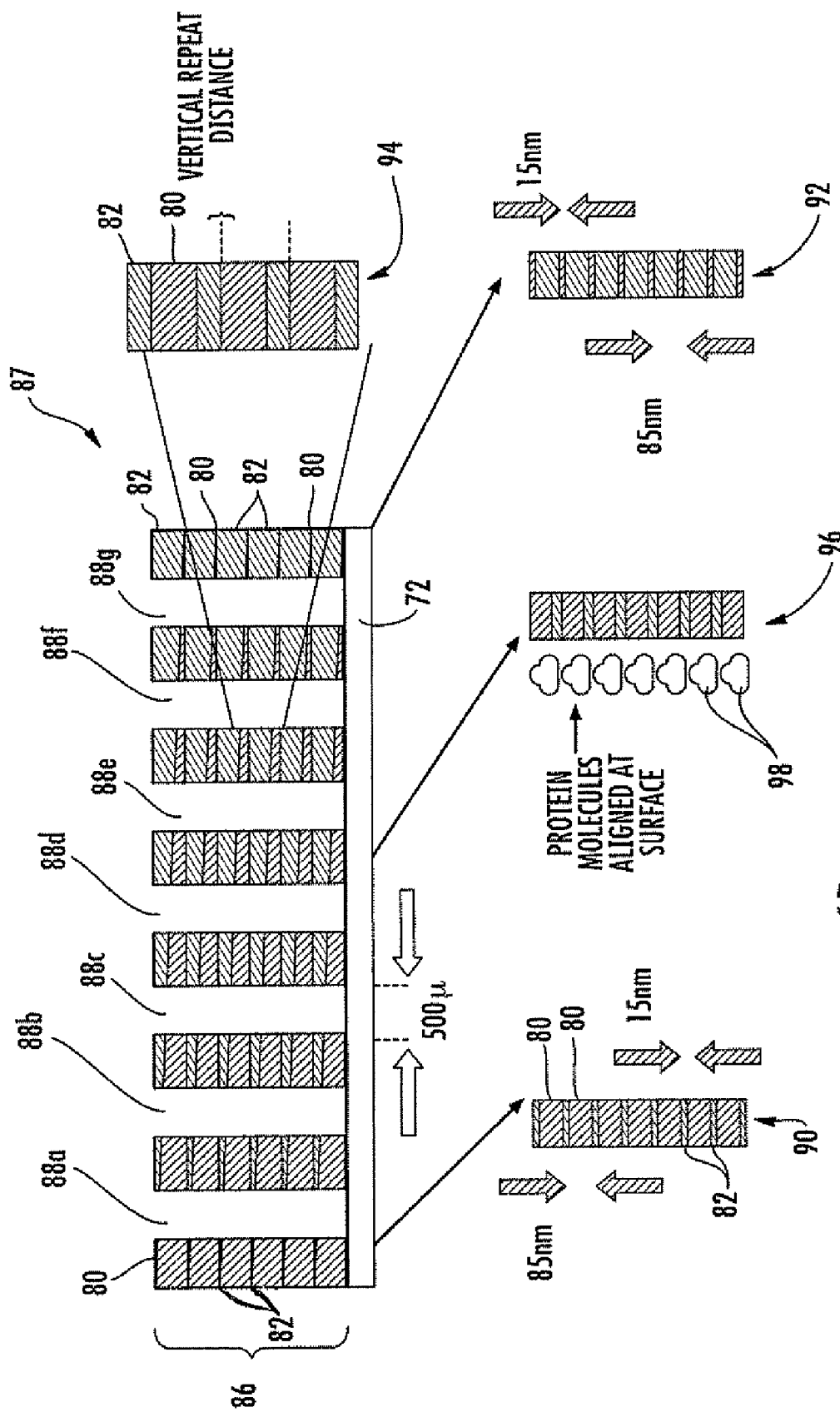

The multilayer stack 86 formed by this method may be considered as a superlattice. After deposition of the desired number of layers 80, 82, the sum of the thicknesses of the two layers 80, 82 at any point on the substrate 22 should be a constant (i.e., the stack 86 should not be "tilted"), Following completion of stack 86, photoresist posts 78 may be removed with a solvent such as an acetone wash, to leave a crystallization apparatus 87 plurality of crystallization wells 88*a*–88*e* extending into stack 86, as shown in FIG. 6D. The chip 87 now consists of an array of wells 88*a*–88*e* each having surfaces exposed to alternating layers 80, 82, of heteronucleant material A and B, which may be chosen to be different enough in chemical properties such that they provide substantially different affinities for a given macromolecule.

The multilayer stack of FIG. 6D may have a thickness, for example, of about 500 nanometers. The multiple layers 80, 82 may individually range from, for example, between 0.1–1500 Å in thickness across the the chip 50 (a range that should encompass the unit cell dimensions for most proteins) across the apparatus 87. Each layer 80, 82 thus presents different thicknesses of nucleant materials A, B to the different wells 88*a*–88*e* due to the tapered shape of layers 80, 82.

FIG. 6D shows a detail 90 of the layers 80, 82 as the layers 80, 82 are present on the surface of well 88*a*. At well 88*a*, layers 80 are thin relative to layers 82 due to the tapered layer structure, with layers 80 having a thickness of around 85 nanometers, and with layers 82 having a thickness of around 15 nanometers. Detail 92 shows the layer structure associated with well 88*g* wherein layers 82 are relatively thick at 85 nanometers, and layers 80 are relatively thin, with a thickness of around 15 nanometers (i.e., the opposite thickness configuration present in well 80*a* on the other end of the chip 78). Wells 88*b*–88*f*, which are located between wells 88*a*, 88*g*, will have surface adjacent layers 80, 82 of intermediate thicknesses, such as shown in detail 94 (corresponding to well 88*f*) and detail 96 (corresponding to wells 88*d*–88*e*).

Thus if a given macromolecule displays a different binding affinity for one of the nucleant materials A, B for one particular thickness relationship of layers 80, 82 over another, there should exist an optimal layer thickness relationship, as shown in detail 96, that will cause a two dimensional alignment of molecules 98 that will provide an initial step in the nucleation of a protein crystal.

Due to the versatility of the various deposition techniques described above, the number of possible chemical combinations for the contrasting tapered layers 80, 82 are very large. The materials would seem to be limited mainly by the processing conditions required to generate their final form and the compatibility with the photoresist development process. Stacked wedged chips may be comprised of layered inorganic oxides and/or layered organic polymers. Two or three sequentially discharging off axis ultrasonic nebulizers or sputter heads may be used to prepare layered thickness gradients like those shown in FIG. 6D.

For the inorganic materials, the elements in the table above would be suitable for stacked wedged chips. It is also possible to fabricate a chip which includes both inorganic and organic nucleants. The pronounced differences between organic materials and inorganic materials provide a very sharp contrast between layers which is beneficial in the crystallization of certain macromolecules. In one embodiment, for example, a crystallization chip may be produced by the deposition of colloidal $SiO_2$ layers interspersed with a rigid, high $T_g$ material like polyimide which provides a very strong contrast, in terms of chemical composition, hydrophobicity, and exchange protons, between the layers. Various other material combinations will suggest themselves to those skilled in the art.

Figure 7A:
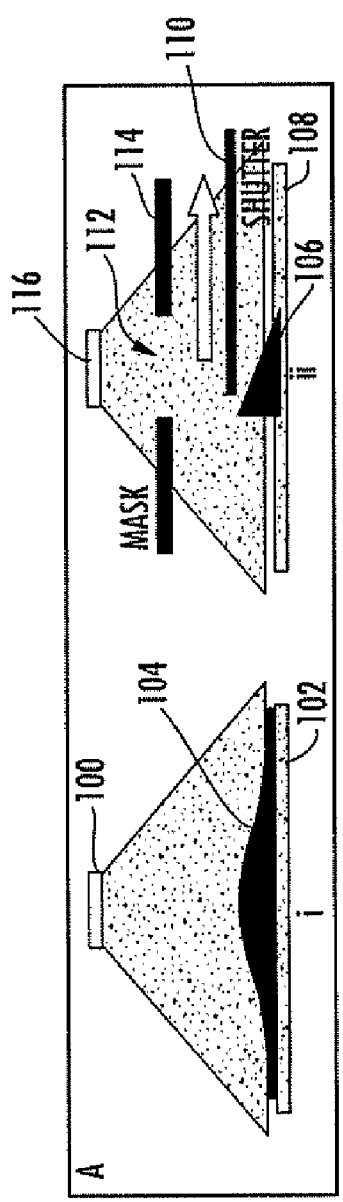
FIG. 7 schematically illustrates the differences between two chip configurations in accordance with the invention.
Figure 7B:
Figure 7C:

Two different chip configurations, one which contains a single vertical repeat distance and those with a continuum of repeat distances, are illustrated in FIG. 7A–D (the features of which are not necessarily shown to scale. In FIG. 7A (i), the unimpeded pattern from an on-axis point source 100 onto substrate 102 is shown as a Gaussian shaped layer or region 104. A rectangular wedge-shaped deposit 106 can be formed on substrate 100, as shown in FIG. 7A (ii), by the movement of a linear motion shutter 110 combined with the aperture 112 in a mask 114 positioned between substrate 108 and source 116. The deposition operations shown in FIG. 7A (i) and A (ii) give the profiles shown in FIG. 7B(i) and B(ii), respectively. The profiles shown in FIG. 7C (i) and C (ii) are those of FIG. 7B(i) and B(ii) rotated 90° about vertical axes (not shown). The superlattice structure 118 shown in FIG. 7D (i) is a cross-sectional view of a deposit from two on-axis Gaussian sources (not shown), while the tapered layer structure 120 in FIG. 7D (ii) is generated from the shuttered deposition (FIG. 7A(ii)) of two on-axis sources but with opposite directions of motion of the shutter.

Figure 7D:
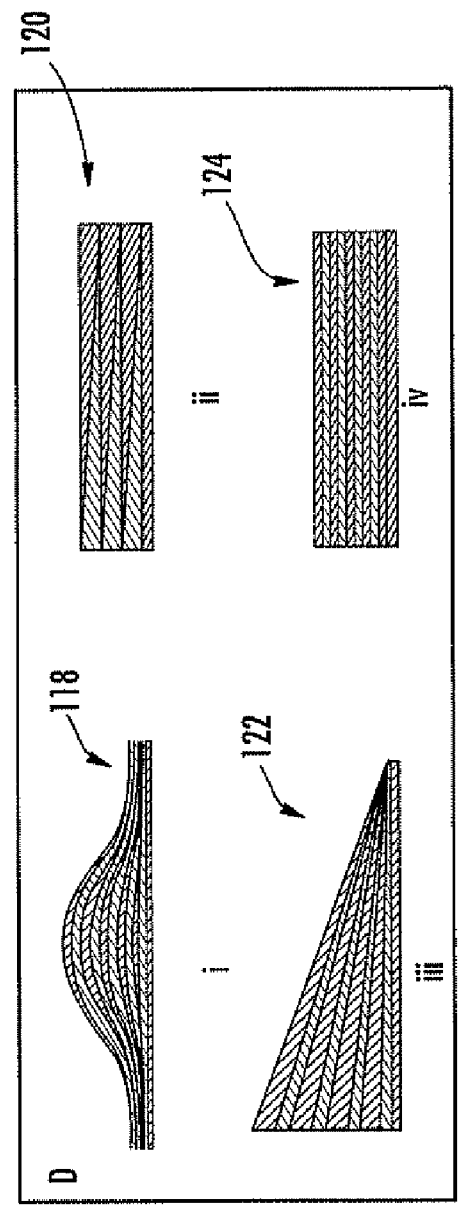

The multi-layer structure 118 of FIG. 7D(i) illustrates that the variation or gradient in nucleation properties provided across a chip may be non-linear in nature. That is, the relative taper of the individual layers in FIG. 7D(i) is a non-linear function, while the taper in the layer structure 122 of FIG. 7(d)(iii), by way of comparison, is linear. FIG. 7D(iv), for further comparison purposes, shows an untapered layer structure 124. The variation or gradient in nucleation properties provided by the layered structures may also be present in a periodic pattern or modulation. For example, the relative thicknesses (or composition gradients) of individual layers may vary sinusoidally across a crystallization ship. Creation of such periodic patterns can be achieved by known photolithography techniques by creating a diffraction pattern to define the desired periodicity.

Another embodiment of a stacked heteronucleant chip is illustrated in FIG. 8A–8C, wherein a crystallization apparatus 126 is shown, with like reference numbers used to denote like parts. In fabrication of the apparatus 126, tapered layers 80, 82 are formed in the manner described above with regard to FIG. 6. Instead of creating posts of photoresists as described above, photo-resist material is deposited and patterned to define channels 128. The photoresist material is subsequently removed by dissolution as described above. Protein solution introduced to channels 128 will be exposed to different thicknesses of layers 80, 82 across the apparatus 126.

In yet another embodiment, the stacked heteronucleant chip configuration may comprise wedged shaped layers of heteronucleant material wherein each wedge-shaped layer also includes a composition gradient. FIG. 9 is a schematic representation of such a wedged stacked heteronucleant crystallization chip 130 with layers 132, 134, wherein the chip 130 varies both in relative layer thickness and vertical repeat distance. In this embodiment, the masking scheme for fabrication is based on linear gradients of nucleant materials deposited at 90° with respect to one another, to form the crystallization chip 130. Deposition of the nucleants at 90°, as shown in FIG. 9, rather than at 180° (as shown in FIG. 7D(ii)), provides for fabricating wedge-shaped layered chips. In addition to changing th relative thicknesses of the two deposited materials as in FIG. 7D(ii), this configuration also allows a known and rational change of the vertical repeat unit (VRU). In FIG. 9, detail views of the corners A, B, C and D show the heteronucleant array chip 130 to have different relative thicknesses and different VRU values, and thus the walls of each well (not shown) on the chip 130 will have different thickness ratios and VRU values. The crystallization wells conceptually corresponding to holes drilled through the superlattice perpendicular to the substrate, and are prepared by depositing over photoresist posts or strips, performing the deposition, and then dissolving the photoresist as described above, to create the wells into which the protein growth solution will be placed.

A crystallization apparatus based on the thickness gradients (stacked wedged configuration) with contrasting and variable thickness layers as shown in FIG. 9, provide the basis of a new type of epitaxy suitable for very large unit cell macromolecules like viruses, oligonucleotides, peptides, proteins and the like. Additionally, the crystallization chips of the invention will provide new scientific information about the fundamental interactions occurring between surfaces and biopolymers.

In other embodiments, the gentle deposition technique provided by the ultrasonic spray system mentioned above, allows for the preparation of chip comprising alternating layers of insoluble biomaterials, including such diverse solids as collagen, membrane components, antibodies and antigens or insoluble proteins.

The crystallization apparatus of the invention circumvent the heretofore insurmountable problem of providing an "epitaxial" substrate, of arbitrary periodicity, with repeat distances large enough to be commensurate with protein or other macromolecule unit cells. The crystallization apparatus provide a fundamentally new type of epitaxy suitable for the growth of crystals of protein, nucleic acid and viruses.

Configuration of the Crystallization Apparatus

The crystallization chips of the present invention, in general, fall into two major categories: 1) chips comprising a continuous gradient of inorganic, organic, metallic or biological composition which are deposited directly onto a chip support surface or by applying precursor heteronucleant solutions onto the support surface, e.g., by spray drying, sputtering, spin coating, chemical precipitation, and other techniques, and 2) chips comprising inorganic, organic, metallic or biological compositions in layered stacks or wedges of thickness gradients which present nucleation sites with variable periodicities on the length scale of protein unit cells. Contrasting chemical layers with the right periodicities, composed of inorganic materials, organic polymers or molecules or biological materials, induce the initial alignment of protein molecules which is required to induce nucleation. The properties of the above two categories may additionally be combined in a single chip, such that multiple tapered layers in a stack each also include a concentration gradient of different nucleant materials.

The crystallization apparatus of the present invention comprises a support surface in which one or more nucleant materials may be deposited. The support surface may be from materials such as glass, organic polymers, silicon, alumina or silica wafers, or like materials. In certain embodiments, the interface between the support surface and a nucleant material by itself defines contacting regions of nucleant materials and is sufficient to support the nucleation of some macromolecules such as lysozyme.

The heteronucleant surfaces of the chip, in general have contrasting chemical, physical or textural modulation and periodicities on the scale of 0.1 to about 2000 nm in length. The heteronucleant surface characteristics are capable of attracting and orienting macromolecules in an adjacent solution, thereby inducing a crystal of the macromolecule to nucleant and grow on a section of the heteronucleant surface or surfaces. In certain embodiments, the interface between two nucleation catalyst materials is capable of attracting and orienting protein, viral or nucleic acid molecules in an adjacent solution, thereby inducing a crystal of the macromolecule to nucleate and grow at the interface of the two surfaces.

Various nucleation catalyst materials useful in the invention may include organic, inorganic, hydrophobic, hydrophilic, acidic and or basic materials. TABLE 2 lists exemplary of heteronucleant materials by the hydrophobicity and acidic characteristics. TABLE 2 also lists the critical surface tension of those heteronucleants with useful hydrophobicity characteristics.

TABLE 2

| PROPERTIES | EXAMPLES | CRITICAL SURFACE TENSION |
|---|---|---|
| Hydrophobic/ Hydrophilic | | |
| Hydrophobic solids: | Polytetrafluoroethylene | 18.5 |
| | Methyltrimethoxysilane | 22.5 |
| | Paraffin wax | 25.5 |
| Hydrophilic solids: | $SnO_2$ | 111 |
| | $TiO_2$ | 91 |
| | $Al_2O_3$ | 84 |
| Intermediate hydrophilicity solids | Aluminum | 45 |
| | Gold | 44 |
| | Glass (soda lime) | 47 |
| Acidic/Basic | | |
| Acidic solids (aq. insoluble) | $SnO_2$ | |
| | $SiO_2$ | |
| Basic solids (aq. insoluble) | $La_2O_3$ | |
| | $Y_2O_3$ | |
| Amphiphilic | ZnO | |
| | $Al_2O_3$ | |

In certain embodiments, the crystallization chips comprise a plurality of nucleant materials deposited onto the support surface, configured in a continuous gradient of the nucleant materials.

The thickness of the deposition of the heteronucleant layer(s) on the chip vary with the type of chip fabricated. For chips comprising a continuous gradient, the thickness of the heteronucleant layer or layers may range from about 0 to about 50 μm. For chips with a stacked heteronucleant configuration, the vertical repeat unit may range from about 0 to about 200 μm. The chip may further comprise a layer of photo resist material on top of the nucleant material which allows for an array of holes or channels to be formed on the surface or penetrating into the continuous heteronucleant gradient. This lithographic fabrication method forms dense arrays of wells exposed to heterogeneous nucleants with the wells designated to hold the potentially scarce and valuable protein growth solution defined by small wells in a hydrophobic photoresist overlayer. Each well of the chip is capable localizing a small volume of the aqueous solution, which is confined in the well by its inability to wet the hard-baked photoresist (highly crosslinked polymethylmethacrylate).

Methods of Crystallization

The invention provides methods for delivering solutions of macromolecules onto to non-adventitious heterogeneous nucleation agents of the of the crystallization apparatus to induce nucleatoin of the macromolecules. The method of delivering the solution of macromolecules to the crystallization apparatus in some embodiments comprises delivering the macromolecular solution by automated liquid dispensing apparatus such as an inkjet device, an air-driven or positive displacement device or by motorized syringes or by pipettes.

In other embodiments the delivery of the macromolecular solution to the crystallization apparatus may comprise the liquid drop deposition technique which uses the surface tension properties of the solution to efficiently contact the crystallization apparatus. The volume of macromolecular solution needed for crystal nucleation is dependent on the configuration of the crystallization apparatus, the concentration of the macromolecule in solution, the method of liquid delivery, the purity of the solution and the like. The volume of macromolecular solution delivered to the crystallization apparatus for crystal formation may range from about 10 picoliters to about 10 ml, 0.1 nanoliter to about 1 ml, 1 nanoliter to about 0.1 ml, 10 nanoliters to about 10 ul, and 0.1 ul to about 1 ul.

The devices and techniques for the delivery of solutions associated with the crystallization of a macromolecule of interest onto a chip substrate include, but are not limited to, techniques and devices related to microfluidic, MEMS (micro electro mechanical systems) or micromachining techniques. Volumes delivered by microfluidic techniques include the volume ranges mentioned above and more specifically the handling of volumes of about 150 microliters or less. The delivery of buffers and macromolecule solutions to the substrate and wells therein at appropriate volumes may be achieved by automated or manual means. These fluid handling devices may also include associated pumps, valving and actuators. Exemplary pumps useful in solution delivery include but are not limited to those based on operating principles such as peristalsis, piezoelectric, shape memory alloy, diaphragm or any other type of pump capable of generating pressure differentials, etc. These pumps can be located external to the chip or be an integral part of the crystallization apparatus.

When only one macromolecule solution is to be examined on a crystallization apparatus, in certain embodiments the wells of the chip can be loaded with solution by dipping the chip into the protein solution or pipetting the solution over the surface of the chip. The hardened photoresist surface remaining on the chip is very hydrophobic, while the oxide surfaces of nucleant materials are hydrophilic, allowing the aqueous macromolecule solution to preferentially fill only the wells (this phenomena is a common observance during chip fabrication) on the chip surface. If a plurality of macromolecule solutions is to be examined, then the various solutions maybe placed into selected wells via automated or manual pipetting.

Once the macromolecule solution is in contact with the heteronucleants of the crystallization apparatus, in certain embodiments, the method of growing crystals may further comprise the technique of vapor diffusion. In this instance, the chip is placed in a closed container above a solution of greater osmotic strength, which slowly evaporates water from the solution in the wells and thus slowly concentrates the solution containing the molecule to be crystallized. Many possible heteronucleants are evaluated simultaneously to identify which heteronucleant compositions induce nucleation as well as crystal formation. Some chips of the present invention allow for the completion of one hundred to several thousand experiments simultaneously, accelerating the overall process of protein crystallization while utilizing a minimal amount of the macromolecules of interest.

In Situ Analysis of Crystals

Presently, determining the X-ray structure of a crystallized macromolecule entails growing the crystals, identifying and isolating an appropriate crystal to be analyzed, followed by delicately transferring and positioning the crystal with respect to the X-ray diffractometer. This process can be time consuming and very difficult due to the fragility of most macromolecular crystals and tendency of crystals to dehydrate when removed from solution.

The crystallization apparatus of the present invention, in most embodiments, are configured to allow for the detection and analysis of crystals grown in multiple wells or channels of the chip without the removal of the crystal from the crystallization apparatus. The present invention avoids the difficulties of isolating and transferring a crystal from the growth media to a structural analysis device, such as an X-ray diffractometer. Further, the suitability of various crystals present on the chip for x-ray study can be easily determined.

The crystallization apparatus maybe positioned in an X-ray beam in such a manner as to allow a well or channel of the chip containing a crystal to be appropriately aligned within the beam to gather X-ray diffraction data on the crystal. When the crystallization chip comprises an array or matrix of wells and/or channels wherein a plurality of crystals may nucleate and grow in various regions of the chip, the configuration of the crystallization chip allows for the in situ analysis of a plurality of crystals without removing the crystallization apparatus from the X-ray diffractometer.

The various embodiments of the crystallization apparatus mentioned above, whether the chip comprises a heteronucleant continuous gradient, stacked layered heteronucleant, or a wedged stacked heteronuclenat component, are all capable of in situ X-ray diffraction analysis. The present invention allows the completed process of obtaining a macromolecular crystal structure (e.g. nucleation, crystal growth, detection of crystals and structural analysis) within one apparatus.

Another technique which is employed to analyze nucleation and crystal formation in situ on the apparatus of the invention is Atomic Force Microscopy or AFM. AFM is a powerful tool for the investigation and characterization of surfaces of all kinds, from the plasma membrane of living cells, to the growing surfaces of conventional and macromolecular crystals, to the hard surfaces of inorganic crystals and integrated circuits on silicon chips. This technique provides a detailed topological map of the entire surface at resolutions, in the best of cases, of near atomic level. It is relatively straightforward to use, and it can be applied in vacuum, in air, or in the presence of fluids. In particular, it can be employed with surfaces immersed in the mother liquors that give rise to macromolecular crystals. For the methods and crystallization chips of the invention, AFM can be useful for characterizing both the topological features of the combinatorial surfaces and the character of the protein, nucleic acid, and virus crystals are grown on them in situ. AFM is a preferred tool for the direct visualization of the chip surfaces. AFM also allows orientations and dispositions of the crystals that nucleate on the chip surfaces to be examined.

Various other analysis methods of crystals may be carried out in situ using the crystallization apparatus of the invention, including optical and fluorescent microscopies, solid state nuclear magnetic resonance studies, and other techniques used in the characterization of crystals.

Fabrication of Crystallization Apparatus

The apparatus of the invention may be prepared using a co-spray dry apparatus from Sono-tek, Inc. of New York. This co-spray dry apparatus uses a combination of ultrasonic nebulization and spray drying techniques as a highly versatile, low temperature synthetic route for generation of heterogeneous nucleation libraries. The co-spray dry apparatus produces a fine, collimated spray consisting of droplets centered around about 10–20µ in size at room temperature, with the droplets directed onto a warm substrate whereon rapid evaporation leaves a thin film of the solute from the droplets. The spray mist and/or droplets are generated where liquid is introduced into a Titanium alloy horn which is driven by surrounding piezoelectric transducers as shown in FIG. 1. Introduction of about 1 watt of power at an ultrasonic frequency of around 100–200 kHz to the transducers completely nebulizes flow volumes (delivered by syringe pumps) between 0.1 and 5 mL/min. A focusing air shroud shapes and collimates the spray to the desired geometry.

The co-spray dry apparatus, or other co-deposition apparatus, may be used as the deposition source to deposit th films or layers of nucleation catalyst materials that will make up the active components of the heterogeneous nucleation sites on the protein crystallization chips. The spray dry apparatus can fabricate discrete layered structures or continuous composition gradient structures in accordance with the invention. The simple case of making a linear gradient of two components by employing the simultaneous discharge of two dilute solutions is shown in FIG. 10, wherein a half-circle disk or mask 136 is positioned between spary heads or other sources 26, 28 and the base 22 with gradient layer 24 thereon. As an estimation of the thickness of the deposition after evaporation of the drops raining on the warm substrate surface, it was determined that a droplet with an approximate diameter of about 101µ and a concentration of about $10^{-3}$ M of nucleant precursor (10 g/mol) gives a deposit approximately 7 Å thick over an area of about 80µ². Either the sequential or layered film synthesis can be arbitrarily extended to higher dimensionality by the addition of additional sources.

To overcome problems with the interference of the two counter-blowing liquid mists during a simultaneous deposition from sources 26, 28, the half circular-shaped mask 138, which has about the same diameter as the distances separating sources 26, 28, is used. Mask 138 is mounted on a rotating shaft 140 and driven by a motor (not shown). The shaft 140 is positioned approximately at the mid-point between sources 26, 28, and the speed of rotation can be controlled from about 0.01 rotations/sec to 20 rotations/second. The rotating shutter 138 alternately blocks the spray stream from sources 26, 28 during a co-spraying process and completely eliminates any interference between the two air-shaped liquid streams (not shown) emitted from sources 26, 28, resulting in an even-shaped thickness profile from both nucleant materials A and B on the chip 20. This allows the quantification of the stoichiometry and thickness profiles of the heteronucleant arrays generated by the co-spraying process to be accurately controlled. It should be note that when the shutter is rotating rapidly compared to the deposition rate, the deposition approximates a continuous gradient, while when the shutter rotation is fast compared to the deposition rate, the deposit takes on the form of stacked, interleaved wedges as discussed above.

The angular relationship and distance between the two spraying heads 26, 28 for solutions of nucleants A and B may be adjusted to obtain a combined flat plateau of desired size along the spraying direction as the two solutions (A and B) build up on the wafer 22. For example, positioning of spray heads 26, 28 on opposite sides of a chip or substrate (i.e., 180° apart with respect to the substrate center) to be coated can provide the interleaved tapered layer structure shown in the crystallization apparatus 126 of FIG. 8. Positioning spray heads 26, 28 at 90° apart with respect to the substrate center (or at other angles) allows fabrication of wedged, tapered structures like the crystallization apparatus 130 of FIG. 9. The spray dry apparatus works well with substrate sizes of about three inches in diameter. Preferably, there should be a substantially identical linear thickness slope (reverse in direction) that spans the substrate width (i.e. 3 inch wafer) generated from the two sprayers 26, 28. The 3-inch wafer is placed within this region to collect identical amount of solid along the spray direction but linearly varying A/B compositions.

To analyze the spraying deposition characteristics from the spray dry apparatus, blue dye was added to alcohol (95% EtOH) to create a blue solutions, and the dyed alcohol was fed into spray heads 26, 28 and sprayed simultaneously onto a paper target with a 3-inch diameter. The angular speed of the rotating mask 138 was set to about 0.2 rotations/second, with the spraying duration sufficient to visibly detect dye on the paper. The dyed paper was scanned and analyzed with image analysis software to determine the intensity of the dye linearly across the paper. FIG. 11 graphically illustrates (relative absorption vs. inches) a scanned profile of the dye intensity across the paper. The dye thickness variation is less than 5% along the length scanned (one inch). In addition to the compositional gradient across the paper (the A–B line), there was also a thickness gradient of the A and B across to the A-B line as shown in FIG. 11.

A combinatorial physical vapor deposition (PVD) apparatus such as a dual-gun sputter or a pulsed laser deposition system equipped with a target carousel and motorized shutter mask, may also be used for fabrication of the crystallization apparatus of the invention. These deposition devices were used to manufacture hetero-surfaces and interfaces for nucleating proteins and other molecules. PVD devices generate a high quality coating surface and smooth interface, due to the uniformity of the deposit and fine control of deposition rates (typically 0.1 to 1 Å/second).

Sputtering is a commonly used thin film deposition method in the microelectronics art for generation of device quality coatings. Either DC (for a conductive target) or RF (radio frequency, for an insulating target) power can be applied to a material target disc in a low pressure argon environment to generate an $Ar^+$ plasma, the ions of which bombard the negatively biased target and vaporize surface atoms upon impingement thereon. The atomic vapor will deposit onto underlying substrate with a thickness profile similar to that of spraying, but in much finer scale, with very good surface smoothness. Like the mechanism for making A-B composition gradients with the co-spray dry apparatus described previously, two sputter guns with different materials can be alternately or co-sputtered to generate a high quality. compositional/thickness gradient library. Deposition can be further controlled through the use of masks and shutters as described above.

Multilayer interface structures and gradient structures of nucleant materials may be generated by the co-sputtering deposition using the target and substrate arrangement 141 shown in FIG. 12. Two targets 142, 144 were used to make heteronucleant composition arrays, one target comprising, for example, $Bi_2O_3$, and the other comprising Ti metal. Two photoresist-patterned three-inch diameter $SiO_2$-coated silicon wafers 146, 148 were used as chip support substrates, with the two wafers symmetrically arranged with respect to the two targets inside the sputtering chamber (not shown). As shown in FIG. 12, targets 142, 144 are positioned 90° away from each other with respect to the centers of wafers 146, 148. The photomasks 150 contained an array of 1 mm diameter darkened dots on a UV-clear background. The substrates 146, 148 were positioned about six inches below the targets 142, 144, and the target-target separation was about four inches. A total of 5 layers each of $Bi_2O_3$ and Ti were alternately sputter deposited onto the silicon wafer, with each layer being about 100 nm from the point of thickness monitor 151 mounted between the targets. The Gaussian distribution of the sputtering profile generated a $Bi_2O_3$/Ti composition gradient along the target-target axis 152 as well as a thickness gradient of varying period length across the chips 146, 148 in a direction normal to the target-target axis 152. After sputter deposition, the two wafers 146, 148 were rinsed in acetone to remove the photoresist spots of mask 150 and to expose the newly formed wells (not shown). The walls of each well provide a distinct heteronucleant composition different from any other well on the chips 146, 148. This chip fabrication method allows for every area of the chip to have a heteronucleant multilayer structure distinct from any other point on the chip.

Another method for fabrication of the crystallization chips utilizes a combinatorial pulsed laser deposition system (CPLD) 154, shown in FIG. 13, equipped with an automated 8-target carousel 156 and a motorized mask controller (not shown). A KrF excimer pulsed laser (not shown) was used to generate a beam 158 to ablate the selectable targets 160a–160h, with each target 160a–160h comprising a different nucleation catalyst material of interest. The laser pulse generates a rapid thermal pulse on the surface of the targets 160a–160h, allowing the elements of the targets 160a–160h to be vaporized and deposited through the selected mask pattern on the library substrate or support (not shown) positioned on the center of carousel 156.

By scanning the laser across a two inch diameter-rotating target with controlling optics, a thin film with less than 2%. thickness variation across a 1-inch substrate was generated. The thickness variation was determined by an optical profilometer and AFM. The scanning and rotation of the target provides for uniform distribution of the laser pulse on the target surface. The deposition chamber was maintained at a vacuum of better than $10^{-7}$ Torr with cryogenic-pump to maintain a clean elemental deposition environment. A load-lock chamber (not shown) was used for sample or substrate exchanges without breaking the vacuum of the main vacuum chamber. Different targets can be switched on the carousel 156 in-vacuo to make multi-components thin film libraries rapidly.

The fabrication methods of the invention may also utilize standard photolithographic procedures that are widely used in microelectronics to configure specific patterns of photomask onto chips or wafers. The following photolithographic procedure is exemplary. In general, a ~ two μm thick positive photoresist coating was spun onto an acetone primed three inch diameter silicon wafer at angular speed of 4000 RPM, with a spinner. After soft baking at 90° C. for 10 minutes for solvent evaporation, the wafer with the photoresist coating was mounted into a mask aligner and exposed to UV light for about 10 seconds through the photomask (exposure time may vary with different UV light intensity and photoresist grade and thickness). The chip was then dipped into a beaker of basic developer until the exposed photoresist dissolved, followed by rinsing with deionized water. The standard photomask is made from chromium metal on glass plate, which is commercially available. Some lower grade but far cheaper photomasks can also be made by inkjet printing a transparency with a masking pattern made by AutoCAD™. The periphery of the photomask holes made by inkjet printing are not as smooth as provided by a chromium photomask, due to the printer resolution limitations (1200 dpi) and poorer UV blocking of ink compared to metal.

EXAMPLES

The following examples are put forth so as to provide those of ordinary skill in the art with a complete disclosure and description of how to make and use the present invention, and are not intended to limit the scope of what the inventors regard as their invention nor are they intended to represent that the experiments below are all or the only experiments performed. Efforts have been made to ensure accuracy with respect to numbers used (e.g. amounts, temperature, etc.) but some experimental errors and deviations should be accounted for. Unless indicated otherwise, parts are parts by weight, molecular weight is weight average molecular weight, temperature is in degrees Centigrade, and pressure is at or near atmospheric.

The following two procedures were used in performing the protein crystallization experiments using the heteronucleant chips of the invention.

Example 1

Batch Crystallization

Protein aqueous solution (with pH buffer) and a aqueous salt solution (typically in the same pH buffer) are first filtered through 0.2 μm syringe filter, then mixed in a selected volume ratio (the concentrations of solutions are typically made so that equal volume of solutions are mixed). The solution thus prepared was applied to chip surfaces in either one of the two ways:

1) A common layer of solution was applied over entire chip surface area, by compressing and sandwiching a sufficient volume of solution on the surface with a siliconized glass slide; the sandwich was sealed by peripheral vacuum grease. In this case, all different hetero-surfaces on the chip are subjected to an identical layer of protein-salt solution, and the wells on the surface compete for the "fittest" in forming protein crystals.

2) A pipette or automated liquid dispenser was used to distribute an array of protein-salt mixture dots in registry to the array of different hetero-surfaces spots (wells) on the crystallization chip. The loaded chip was sealed either under siliconized glass slide with vacuum grease, or in a sealed container with a rubber O-ring. This approach permits many crystallization experiments to be performed on different surfaces independently and simultaneously. The assembly was then placed into an incubator at an appropriate temperature for protein crystallization.

Example 2

Vapor Diffusion Crystallization

An artificial hetero-surfaces library was made, according to the methods described above, on a chip (typically 1×1 cm), pieces of which can fit into the cell of a 24-wells Q-plate (e.g. the "Q-plate" from Hampton Research). The chip was mounted on the post of a Q-plate cell with vacuum grease. Aqueous protein solution (with pH buffer) and a aqueous salt solution (typically in the same pH buffer) were first filtered through 0.2 μm syringe filter, then mixed in a selected volume ratio (the concentrations of solutions are typically made so typically equal volume of solutions are mixed). The solution was applied to the hetero-surface or combinatorial hetero-surface of a crystallization chip with many different surface compositions or thickness profiles, either in a single liquid layer or in an array of liquid dots, as described in the batch crystallization method above. The salt solution, against which the protein solution to crystallized, is placed into a cell surrounding the chip surface (typically in volume ratio of 50:1 to the volume of protein mixture on the chip). The cell is then sealed under a siliconized glass with vacuum grease, and placed into an incubator set at a selected temperature for vapor diffusion. The huge reservoir of salt solution vapor diffuses with protein solution on top of every hetero-surface, and the well or location on the chip surface with the most effective arrangement of nucleation properties will first crystallize proteins.

Example 3

Protein Solutions and Crystallization Result Summary

Six different proteins were examined for crystal formation using the crystallization apparatus and methods of the invention. TABLE 3 provides a detailed list of each protein analyzed and its corresponding salt solution compositions.

TABLE 3

Lysozyme:
A: 2.5% (w/v) chicken egg Lysozyme (30 mg/ml) in 0.05 M sodium acetate and 0.01% $NaN_3$ adjusted with HCl to pH 4.8
B: 6.5% (w/v) solution of NaCl in 0.1 M sodium acetate and 0.02% $NaN_3$ adjusted with HCl to pH 4.8

TABLE 3-continued

Thaumatin:
A: 8 mg/ml aqueous solution with pH = 7.3
B: 2 Molar of Na/K tartrate solution (pH = 7.3)
Trypsin:
A: 60 mg/ml trypsin in 10 mg/ml benzamidine, 3 mM $CaCl_2$ and 0.02% $NaN_3$
B: 18% (w/v) PEG 4000 aqueous solution
Ribonuclease
A: 20 mg/ml aqueous Ribonuclease solution
B: 18% (w/v) PEG 4000 aqueous solution
Myoglobin:
A: 20 mg/ml aqueous solution
B: 18% (w/v) PEG 4000 aqueous solution

TABLE 3-continued

Beef Catalase
A: 50 mg/ml beef catalase in 0.02% $NaN_3$
B: $NH_4OH$ water

In Table 4 a summary of several of the protein crystallization examples and experiments described below, is provided. TABLE 4 summaries type of heteronucleant(s) present in the crystallization chips, the buffer and reagent conditions for the specified protein, as well as the results of protein nucleation. The term "AGTIN" means Artificial Gradient-Thickness Interfacial Nucleant

TABLE 4

Heterogeneous Nucleation Systems

| Protein/Salt mix; (conc.) | Heterogeneous Nucleant System | Crystallization Event | Control Results | Comments |
|---|---|---|---|---|
| Lysozyme (30 mg/ml)/ NaCl (3.25 w/v) & buffer pH = 4.8 | Photoresist (PR) patterned with array of openings on $SiO_2$ surface | Protein, at 4° C., crystallized in < 16 hours, mostly at PR/$SiO_2$ boundary | Protein started crystallizing on PR surface after 2 days at 4° C. | Protein crystals at interfaces showed atypical, unusual needle habit |
| Lysozyme (30 mg/ml)/ NaCl (3.25 w/v) & buffer pH = 4.8 | Sputter($Bi_2O_3$/Ti)$_5$ gradient interface library with holes on silanized Si | Lysozyme, at 4° C., crystallized in 2 days, only @ one corner of library | Lysozyme crystallized across entire wafer after 4 days | Gradual transit. from crystallized corner to corner with no crystals |
| Pure aqueous Lysozyme (50 mg/ml) NO SALT NO BUFFER | pH/Salt gradient sprayed on spun coated $Cu_3(PO_4)_2$ surface exposed by PR hole array | Lysozyme crystallized only in certain region of pH/salt gradient at 4° C., in 1 day | No crystals on same pH/salt gradient on silanized surface after 2 days | Crystal starts on similar pH/salt gradient on $SiO_2$, $Al_2O_3$ surfaces < 2 days |
| Lysozyme (15 mg/ml)/ NaCl (3.25 w/v) & buffer pH = 4.8 | Laser deposition ($TiO_2$—$MnO_2$)$_5$ AGTIN library | Lysozyme crystallized on hetero-surfaces at 23° C., in 2 hours | Smaller Lysozyme crystallized on silanized surface after 20 hour, 23° C. | There is little difference of ($TiO_2$—$MnO_2$)$_5$ interface vs. $TiO_2$, $SiO_2$ surf. |
| Lysozyme (30 mg/ml)/ NaCl (3.25 w/v) & buffer pH = 4.8 | Laser deposition ($TiO_2 \perp MnO_2$)$_5$ AGTIN library | Crystallized along Ti rich interface of ($TiO_2 \perp MnO_2$)$_5$ at 23° C., in 1 hour | Smaller Lysozyme crystallized on siliconized surface after 20 hour, 23° C. | Both cubic and needle habits originated from some interfaces of ($TiO_2$—$MnO_2$)$_5$ |
| Thaumatin (16 mg/ml)/ Na/K tartrate 1M, pH = 7.3 | Spun on $SiO_2$, $Al_2O_3$, $Cu_3(PO_4)_2$ surfaces exposed by patterned PR hole array | Large bipyramidal Thaumatin crystallized on $SiO_2$ surface at 4° C. in 1 day | Medium bipyramidal crystals on silanized surface after 2d at 4° C. | Thaumatin crystals on $Al_2O_3$ and $Cu_3(PO_4)_2$ surfaces 4° C. in 1 day |
| Thaumatin (8 mg/ml)/ Na/K tartrate 1M, pH = 7.3 | Laser deposition ($TiO_2$—$MnO_2$)$_5$ AGTIN library | Crystallized along Ti rich interface of ($TiO_2$—$MnO_2$)$_5$ at 23° C., in 2 hours | No crystals on silanized surface after 44 hour, 23° C. | After 20 hours, crystals also show up on hetero-surfaces |
| Trypsin (30 mg/ml)/ PEG 4000 (9% w/v) & buffer | Laser deposition ($TiO_2$—$MnO_2$)$_5$ AGTIN library | Trypsin crystallize on Ti rich interface of ($TiO_2$—$MnO_2$)$_5$ at 23° C., 2 hours | No crystals on siliconized surface after 44 hour, 23° C. | Diff. crystal polymorphs formed at interface vs hetero-surfaces |
| Trypsin (30 mg/ml)/PEG 4000 (9% w/v) & buffer | Laser deposition ($TiO_2 \perp MnO_2$)$_5$ AGTIN library | Trypsin crystallized on Ti rich interface of ($TiO_2 \perp MnO_2$)$_5$ at 23° C., in 20 hr | No crystals on silanized surface after 44 hour, 23° C. | After 44 hours, Trypsin crystals also appear on hetero-surfaces |
| Ribonuclease (20 mg/ml)/ PEG 4000, 9%, buffer | Laser deposition ($TiO_2$—$MnO_2$)$_5$ AGTIN library | Crystallized along Ti rich interface of ($TiO_2$—$MnO_2$)$_5$ at 23° C. 20 hours | No crystals on silanized surface after 44 hours, 23° C. | No apparent liquid loss after 44 hours vapor diffusion @ 23° C. |
| Beef catalase 25 mg/ml, aqu. $NH_4OH$ pH ~9 | Laser deposition ($TiO_2 \perp MnO_2$)$_5$ AGTIN library | Started crystallizing in 1.5 hr at 23° C., all over the hetero-surfaces | No crystals on silanized surface after 20 hour, 23° C. | Little difference in ($TiO_2 \perp MnO_2$)$_5$ interface vs. $TiO_2$, $SiO_2$ surf. |

TABLE 4-continued

Heterogeneous Nucleation Systems

| Protein/Salt mix; (conc.) | Heterogeneous Nucleant System | Crystallization Event | Control Results | Comments |
|---|---|---|---|---|
| Myoglobin (20 mg/ml)/ 9% (w/v) PEG 4000 | Laser deposition $(TiO_2 \bot MnO_2)_5$ AGTIN library | Solution became opaque after 20 hours at 23° C., no large crystal forms | Protein solution still clear after 44 hours | No apparent liquid loss after 44 hours vapor diffusion @ 23° C. |

Example 4

Lysozyme Crystals Grown with $SiO_2$ and Polymethyl Methacrylate Heteronucleants One crystallization chip examined was prepared by oxidizing a silicon wafer in air at 1000° C. to give a coating of $SiO_2$ on the wafer. Next, a layer of photoresist was spun on the $SiO_2$ coating and an array of ~1 mm wide, shallow (1–3μ) wells were fabricated in the photoresist, giving a well matrix having well bottom surface adjacent to $SiO_2$, and with wall surfaces adjacent to polymethyl methacrylate photoresist. After development, the remaining photoresist was hard-baked (highly crosslinked polymethymethacrylate) to give a hydrophobic, water-insoluble polymeric material. The interface of the $SiO_2$ and photoresist material provides a nucleation site for protein crystals. The entire surface of the crystallization chip was then flooded with a lysozyme growth solution (see TABLE 4), such that the growth solution contacted both the photoresist (organic) and silica (inorganic) portions of the chip surface. A control experiment consisted of placing the identical solution on a silanized glass cover slip.

As shown in the photograph of FIG. 14, lysozyme crystals were formed which had an unusual fibrous habit, and these fibrous crystals nucleated and grew nearly exclusively at the organic-inorganic photoresist (light)—$SiO_2$ (dark) boundary. These crystals formed after <16 hrs at 4° C., whereas in the control sample crystallizing initiated only after 4 days and yielded the normal large, prismatic crystals indiscriminately over the entire flooded surface. The photograph shown in FIG. 14 was taken after several days and crystals had begun to form on the photoresist as well as the interface, but the initial nucleation is still visible as being at the Photoresist-$SiO_2$ interface.

Example 5

Lysozyme Crystals Grown on Chip with $Bi_2O_2$ and Ti Heteronucleants

In this example, a crystallization chip (superlattice heterogeneous nucleant (SHN) library) based on $Bi_2O_3$ and Ti metal was utilized to examine the nucleation of a protein lysozyme. The $Bi_2O_3$ and Ti metal nucleation catalyst materials were chosen based on their chemical contrast, e.g. metal/oxide, hydrophobic/hydrophilic property contrast. The chip was prepared by the off-axis deposition from the two sources giving a superlattice like the one shown in FIG. 7D(i) and described above. The Gaussian distribution of the sputtering profile generated a $Bi_2O_3$/Ti composition gradient along the target-target vector, and a thickness gradient of varying period length perpendicular to the composition gradient. The disposition of the two nucleant sources relative to the two substrates, which are mirror images of one another, is illustrated in FIG. 12. Two identical chips with $Bi_2O_3$ and Ti nucl ants were prepared simultaneously by this fabrication method. Each well on a chip has a different superlattice modulation and vertical repeat unit on its walls. Photoresist patterning was used to provide a well (library) density of around 1600 wells per $cm^2$. The four "corners" of the well arrays on the chip surfaces are shown in FIG. 12 by the numbers "1", "2", "3" and "4".

After deposition, the two chips were rinsed in acetone to remove the exposed photoresist and expose the edge surface of each well to the $Bi_2O_3$ and Ti nucleation catalysts. A different superlattice structure is presented to the surfaces of each well. The individual layers of the $Bi_2O_3$/Ti superlattice of the crystallization chip can be clearly seen in the scanning electron micrograph (SEM) shown in FIG. 15. FIG. 15 shows the $Bi_2O_3$/Ti metal superlattice of the chip viewed edge on. The contrast between the layers is due to different Z values and conductivities.

The crystallization experiments using these crystallization chips are shown in FIG. 16, with the numbers "1", "2", "3 " and "4"corresponding to the corner regions of FIG. 12. As seen in FIG. 16, lysozyme crystals only formed at corner regions "2" and "4" of the well library. Even over the relative small area of the well library at corner "2", a smooth gradient in the density of crystals nucleated can be seen. If one proceeds along the diagonal direction away from outermost (top left) part of corner "2", the drop off in crystal density can be seen as steep but smooth. The same solution was placed at each library location, and the same two elements are present over the entire library. Thus, the enhanced nucleation is due to the thickness ratios of the two components of the superlattice of the chip.

Although the underlying physical principles behind macromolecule crystal nucleation are currently not well understood, there is little doubt that the effect of the nucleation properties of the heterogeneous nucleants is strong and specific, as shown in FIG. 16

Example 6

Lysozyme, Trypsin Thaumatin, and Ribonuclease Crystals with $TiO_2$ and $MnO_2$ Heteronucleants In this example, crystallization chips with controlled linear profiles and significant thickness variation, e.g. 0 to 100 nm, in the length scale of 1 cm (see FIG. 7D(ii)), were examined for possible protein crystal growth. Generally, the thickness gradients can be manufactured from 0 to about 500 nm across a 1 cm length in about 10 minutes.

The chips for this example were fabricated using a pulsed laser deposition system, which uses an excimer laser to ablate targets as shown in FIG. 13. Using masks and shutters, deposits of nucleation catalyst materials of uniform thickness to around 1–2% over approximately 5 cm² were prepared. The chips were fabricated to form a heteronucleant superlattice of the type shown in FIG. 7 D (ii) made with $MnO_2$ and $TiO_2$ as nucleation catalyst materials. In order to expose the protein solutions to as many thickness modulations as possible, the chips were fabricated with channels instead of wells, as illustrated in the schematic of FIG. 8.

FIGS. 17–20 show the nucleation results of four proteins, Lysozyme, Trypsin Thaumatin, and Ribonuclease using crystallization chips with $TiO_2$ and $MnO_2$, nucleation catalyst materials configured in a tapered layer architecture as shown in FIG. 8. A summary of the preparation of the protein solutions utilized in this example are listed in TABLE 4. The protein solutions were placed directly onto the crystallization chips, and control experiments were prepared with similar concentrations of protein on silanized glass cover slips.

The photograph of FIG. 17 was obtained after lysozyme solution had been exposed to the superlattice of the chip for 2 hours (23° C.). Each individual well (channel) was viewed with an optical microscope (100×) and a photograph recorded for each cell. None of the protein solutions in the four blank controls crystallized. However, Lysozyme (FIG. 17) had already crystallized on certain regions of the $MnO_2$—$TiO_2$ crystallization chip. As shown in FIG. 17, lysozyme crystals of significant size had proliferated within the central region of the well (channel) within 2 hours. It appears that lysozyme does not crystallize at the $TiO_2$—$MnO_2$ interface, in contrast to the observations in FIG. 14, where lysozyme shows a strong preference to crystallize on the photoresist-$SiO_2$ interface.

FIG. 18 shows tiny crystals of Trypsin growing along the $TiO_2$ rich edge of the $TiO_2$—$MnO_2$ interface, but there was no apparent crystallization of Trypsin along the channel edge of the central, Mn rich region of the channel after 2 hours (data not shown).

The crystallization experiments of FIG. 17 and FIG. 18 were observed again at 3, 4, 20 and 44 hours after the application of protein solution to the chips. The density and size of the lysozyme and trypsin crystals were observed to have increased as a function of time.

FIGS. 19 and 20 show the nucleation of thaumatin and ribonuclease respectively after 20 hours exposure to the crystallization chip. After two hours exposure to the chip, the thaumatin sample showed signs of crystallization only along the Ti rich edge of the $TiO_2$—$MnO_2$ interface, while the ribonuclease showed no sign of crystallization anywhere in the well.

FIG. 21 shows the crystallization of trypsin after 20 hours incubation with the $TiO_2$—$MnO_2$ chip. Globular trypsin crystals can be seen in FIG. 21 to nucleate only at the $TiO_2$—$MnO_2$ interface and $TiO_2$ surface, while needles crystals appear indiscriminately in the center of the cell, suggesting that the needle crystals were homogeneously nucleated from the initial trypsin crystals formed at the interface and $TiO_2$ surface. There were still no crystals in any of the control samples after 4 hours of crystallization time had elapsed with the same protein/salt solution and volume parameters. After 20 hours, only the Lysozyme control sample had started crystallizing on the silanized glass while the other three protein samples had no crystal growth.

The above demonstrates that the superlattice heterogeneous nucleants of the crystallization apparatus of the invention have a very positive effect on protein crystal nucleation. Furthermore, the evidence of growth on certain regions of the chip, but not others, even though the layers in the superlattice have the same composition and vary only in the relative thicknesses to one another, also demonstrate the exceptionally fine degree of control can that can be rationally obtained with nanofabricated heterogeneous nucleant chips.

Example 7

Fabrication and Use of Wedged, Stacked Layer Crystallization Chips

In this example a crystallization chip with channels was utilized to induce protein nucleations. The stacked wedge chip used in this example was prepared according to the structure shown in FIG. 9, allowing the formation of $TiO_2$ and $MnO_2$ wedged layers. This is a different configuration of $TiO_2$—$MnO_2$ nucleants than was used in the chips of the above example. In Table 4, the different $TiO_2$—$MnO_2$ chip configurations are designated as $TiO_2$—$MnO_2$ (for Example 6) wherein alternating contrasting layers of $TiO_2$ and $MnO_2$ are deposited at 180 (stacked tapered layers) relative to one another (as shown in FIG. 8, and as $TiO_2 \perp MnO_2$ for Example 7 wherein alternating contrasting layers of $TiO_2$ and $MnO_2$ are deposited at 90° (wedged stacked layers) relative to one another (as shown in FIG. 9).

FIG. 22 schematically illustrates a dual source combinatorial sputtering deposition system 162 used for fabrication of wedged, stacked layer crystallization chips configured in the manner shown in FIG. 9. This system 162 uses dual sputter guns 164, 166 (additional sputter guns may be used) to introduce nucleants to a substrate (not shown) on sample stage 168 in vacuum chamber 170. A rotating mask 172 is driven by motor 174, and a linear motion (translated) mask 176 is operated by. mask driver 178 according to instructions from controller 180. Sample stage 168 is rotated by motor 182. Deposited layer thickness on substrates is monitored by sensor 184. Vacuum is applied to chamber 170 via pump 186, and back pump station 188 via gate valve 190.

The substrate sample (not shown) is positioned on stage 168 so that the center of the sample substrate will be the focal point of the two gun 164, 166. Suitable sputter guns are commercially available, and in particular, 2-inch sputter guns made by U.S. Inc. of California were used for the manufacturing of crystallization chips in this example. RF (radio frequency) power is fed into the cathode of each sputtering gun 164, 166 via a matching network to balance the external electrical impedance for the most efficient RF output. The thickness monitor 184 (which may be made out of quartz single crystal oscillator) is placed beside the sample substrate and calibrated to monitor the thickness of the deposition to a resolution of 0.1 Å and sputter rates of about 0.025 Å/second.

Four proteins, beef catalase, myoglobin, lysozyme, and trypsin solutions and salt/buffer mixtures were applied to wedged stacked chips of $TiO_2 \perp MnO_2$ made with the apparatus of FIG. 22, and sitting drop vapor diffusion experiments were set up with the corresponding salt solutions. Table 5 provides a summary of some observed results from this series of experiments. Note that lysozyme and trypsin show apparent selectivity in nucleating and crystallizing along the Ti rich region of the wedge interface. Fine crystals of myoglobin also show up in the chip while the control blank sample remained clear. Beef catalase crystals proliferate on all surfaces of the chip with little apparent selectivity, although the overall heterosurfaces significantly speed up the nucleation and crystallization process.

TABLE 5

| Beef catalase 25 mg/ml, aqu. NH₄OH pH ~9 | Laser deposition (TiO₂⊥MnO₂)₅ AGTIN library | Started crystallizing in 1.5 hr at 23° C., all over the hetero-surfaces | No crystals on silanized surface after 20 hour, 23° C. | Little difference in (TiO₂⊥MnO₂)₅ interface vs. TiO₂, SiO₂ surf. |
|---|---|---|---|---|
| Myoglobin (20 mg/ml)/ 9% (w/v) PEG 4000 | Laser deposition (TiO₂⊥MnO₂)₅ AGTIN library | Solution became opaque after 20 hours at 23° C., no large crystal forms | Protein solution still clear after 44 hours | No apparent liquid loss after 44 hours vapor diffusion @ 23° C. |
| Lysozyme (30 mg/ml)/ NaCl (3.25 w/v) & buffer pH = 4.8 | Laser deposition (TiO₂⊥MnO₂)₅ AGTIN library | Crystallized along Ti rich interface of (TiO₂⊥MnO₂)₅ at 23° C., in 1 hour | Smaller Lysozyme crystallized on siliconized surface after 20 hour, 23° C. | Both cubic and needle habits originated from some interfaces of (TiO₂—MnO₂)₅ |
| Trypsin (30 mg/ml)/PEG 4000 (9% w/v) & buffer | Laser deposition (TiO₂⊥MnO₂)₅ AGTIN library | Trypsin crystallized on Ti rich interface of (TiO₂⊥MnO₂)₅ at 23° C., in 20 hr | No crystals on silanized surface after 44 hour, 23° C. | After 44 hours, Trypsin crystals also appear on hetero-surfaces |

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

That which is claimed is:

1. A method for crystallizing a molecule, comprising: (a) providing a first region of a first nucleation catalyst material and a second region of a second nucleation catalyst material adjacent said first region, said first region having a variation in a nucleation property of said first nucleation catalyst material; (b) exposing said first and second regions to a solution of a selected molecule; and (c) growing at least one crystal of said molecule in association with said first and second regions.

2. The method of claim 1, further comprising analyzing said crystal in situ with respect to said first and second regions.

3. The method of claim 1, wherein said providing further comprises positioning said first and second regions to define an interface between said first and second nucleation catalyst materials.

4. The method of claim 3, wherein said growing said crystal is carried out proximate to said interface.

5. The method of claim 1, further comprising providing a plurality of crystallization wells in association with said first and second regions, each said crystallization well having at least one surface adjacent to said first region and exposed to a different portion of said variation in said nucleation property of said first nucleation catalyst material.

6. The method of claim 5, wherein said growing said crystal is carried out in association with said surfbce of at least one said crystallization well.

7. The method of claim 1, wherein said variation comprises a taper in thickness of said first region.

8. The method of claim 1, wherein said variation comprises a concentration variation in said first region.

9. The method of claim 1, wherein said variation comprises a periodicity in nucleation property in said first region.

10. The method of claim 9, wherein said periodicity having a dimension of between about 0.1 nanometer and about 2000 nanometers in repetition length.

11. The method of claim 1, wherein said molecule is selected from the group consisting of proteins, viruses, viral sub-particles, nucleic acids, nucleotides or polypeptides.

12. The method of claim 1, wherein said second region has a variation in a nucleation property of said second nucleation catalyst material.

13. The method of claim 12, wherein said variation in said second region comprises a taper in thickness of said second region.

14. The method of claim 12, wherein said variation in said second region comprises a concentration variation in said second region.

15. The method of claim 12, wherein said variation in said second region defines a periodicity in said nucleation property in said second region.

16. The method of claim 15, wherein said periodicity having a dimension of between about 0.1 nanometer and about 2000 nanometers in repetition length.

17. A method for crystallizing molecules, comprising: (a) providing a plurality of first layers of a first nucleation catalyst material, and a plurality of second layers of a second nucleation catalyst material interleaved between adjacent ones of Bald first layers, said first layers each having a gradient in a nucleation property of said first nucleation catalyst material; (b) exposing said plurality of first and second layers to a solution of a selected molecule; and (c) growing at least one crystal of said molecule in association with said plurality of first and second layers.

18. The method of claim 17, further comprising analyzing said crystal in situ with respect to said plurality of first and second layers.

19. The method of claim 17, wherein said providing further comprises positioning said plurality of first and second layers to define a plurality of interfaces between said first and second nucleation catalyst materials at adjacent ones of said plurality of first and second layers.

20. The method of claim 19, wherein said growing said crystal is carried out proximate to said at least one of said plurality of interfaces.

21. The method of claim 19, further comprising providing a plurality of crystallization wells in association with said plurality of first and second layers, each said crystallization well extending through at least a portion of said plurality of first and second layers, each said well having at least one surface exposed to at least a portion of said plurality of interfaces.

22. The method of claim 21, wherein said growing said crystal is carried out in association with said surface of at least one said crystallization well.

23. The method of claim 17, wherein said gradient comprises a taper in thickness of said first layers.

24. The method of claim 17, wherein said gradient comprises a concentration gradient in said first nucleation catalyst material in said first layers.

25. The method of claim 17, wherein said gradient comprises a periodicity in said nucleation property in said first layers.

26. The method of claim 25, wherein said periodicity having a dimension of between about 0.1 nanometer and about 2000 nanometers in repetition length.

27. The method of claim 17, wherein said molecule is selected from the group consisting of proteins, viruses, viral sub-particles, nucleic acids, nacleotides orpolypeptides.

28. A method for fabrication and use of a crystallization apparatus, comprising: (a) forming a first region comprising a first nucleation catalyst material; (b) forming a second region comprising a second nucleation catalyst material adjacent to said first region; and (c) creating a gradient in a nucleation property of said first nucleation material in said first region.

29. The method of claim 28, wherein said creating said gradient comprises creating a taper in thickness of said first region.

30. The method of claim 28, wherein said creating said gradient comprises a creating concentration gradient in said first nucleation catalyst.

31. The method of claim 28, wherein said gradient comprises creating a periodicity in said nucleation property in said first region.

32. The method of claim 31, wherein said periodicity having a dimension of between about 0.1 nanometer and about 2000 nanometers in repetition length.

33. The method of claim 28, further comprising; (a) exposing said first and second regions to a solution of a selected molecule; and (b) growing at least one crystal of said selected molecule in association with said first and second regions of said substrate.

34. The method of claim 28, further comprising analyzing said crystal in situ with respect to said first and second regions.

35. The method of claim 28, further comprising forming a plurality of crystallization wells in association with said first and second regions, each said crystallization well having at least one surface adjacent to said first region and exposed to a different portion of said gradient in said nucleation property of said first nucleation catalyst material.

36. The method of claim 28, further comprising creating a gradient in a nucleation property of said second nucleation catalyst material in said second region.

37. The method of claim 36, wherein said gradient in said second region comprises a taper in thickness of said second region.

38. The method of claim 36, wherein said gradient in said second region comprises a concentration gradient in said second region.

39. The method of claim 36, wherein said gradient in said second region defines a periodicity in said nucleation property in said second region.

40. The method of claim 39, wherein said periodicity having a dimension of between about 0.1 nanometer and about 2000 nanometers in repetition length.

41. A crystallization apparatus, comprising: (a) a first region comprising a first nucleation catalyst material; (b) a second region comprising a second nucleation catalyst material; (c) said first and second regions positioned adjacent to each other and configured to support at least one crystal; and (d) said first region having a variation in a nucleation property of said first nucleation catalyst material in said first region.

42. The crystallization apparatus of claim 41, wherein said variation comprises a taper in thickness of said first region.

43. The crystallization apparatus of claim 41, wherein said variation comprises a concentration gradient in said first region.

44. The crystallization apparatus of claim 41, wherein said variation comprises a periodicity in said nucleation property in said first region.

45. The crystallization apparatus of claim 44, wherein said periodicity having a dimension of between about 0.1 nanometer and about 2000 nanometers in repetition length.

46. The crystallization apparatus of claim 41, wherein said first and second regions are configured to support said crystal during analysis of said crystal.

47. The crystallization apparatus of claim 46, wherein said analysis said is selected from x-ray analysis, optical microscopy, nudlear magnetic resonance, fluorescent microscopy, and atomic force microscopy.

48. The crystallization apparatus of claim 41, wherein said first and second regions are positioned to define an intetee between said first and second nucleation catalyst materials, said interface configured to support nucleation of said crystal.

49. The crystallization apparatus of claim 41, wherein said first and second regions include a plurality of crystallization wells associated therewith, each said crystallization well having at least one surface adjacent to said first region and exposed to a different portion of said variation in said nucleation property of said first nucleation catalyst material.

50. The apparatus of claim 41, wherein said crystal comprises a molecule selected from the group consisting of proteins, viruses, viral sub-particles, nucleic acids, nucleotides or polypeptides.

51. The crystallization apparatus of claim 41, wherein said first region comprises a plurality of first layers, and said second region comprises a plurality of said second layers, each said second layer interposed between a pair of adjacent said first layers, each said first layer configured to create said variation in said nucleation property of said first nucleation catalyst material.

52. The crystallization apparatus of claim 51, wherein said variation comprises a taper in thickness in said first layers.

53. The crystallization apparatus of claim 51, wherein said variation comprises a concentration gradient in said first layers.

54. The crystallization apparatus of claim 51, wherein said variation comprises a periodicity in said nucleation property in said first layers.

55. The crystallization apparatus of claim 54, wherein said periodicity having a scale/dimension of between about 0.1 nanometer and about 2000 nanometers in repetition length.

56. The crystallization apparatus of claim 51, wherein said first and second layers are configured to support at least one crystal during analysis of said crystal.

57. The crystallization apparatus of claim 51, wherein said first and second layers include a plurality of crystallization wells associated therewith, each said crystallization well having at least one surface adjacent to at least one of said first layers and exposed to a different portion of said variation in said nucleation property of said first nucleation catalyst material.

58. The crystallization apparatus of claim 41, wherein said second region has a variation in a nucleation property of said second nucleation catalyst material.

59. The crystallization apparatus of claim 58, wherein said variation in said second region comprises a taper in thickness of said second region.

60. The crystallization apparatus of claim 58, wherein said variation in said second region comprises a concentration gradient in said second region.

61. The crystallization apparatus of claim 58, wherein said gradient in said second region defines a periodicity in said nucleation property in said second region.

62. The crystallization apparatus of claim 61, wherein said periodicity having a dimension of between about 0.1 nanometer and about 2000 nanometers in repetition length.

63. The crystallization apparatus of claim 58, wherein said first and second regions include a plurality of crystallization wells associated therewith, each said crystallization well having at least one surface adjacent to said first region and said second region and exposed to a different portion of said variation in said first nucleation property of said first nucleation catalyst material, and a different portion of said variation in said second nucleation property of said second nucleation catalyst material.

64. The crystallization apparatus of claim 58, wherein said first region comprises a plurality of first layers, and said second region comprises a plurality of said second layers, each said second layer interposed between a pair of adjacent said first layers, each said first layer configured to create said variation in said nucleation property of said first nucleation catalyst material.

* * * * *